(12) United States Patent
    Alivisatos et al.

(10) Patent No.: US 7,777,303 B2
(45) Date of Patent: *Aug. 17, 2010

(54) SEMICONDUCTOR-NANOCRYSTAL/CONJUGATED POLYMER THIN FILMS

(75) Inventors: A. Paul Alivisatos, Oakland, CA (US); Janke J. Dittmer, Munich (DE); Wendy U. Huynh, Munich (DE); Delia Milliron, Berkeley, CA (US)

(73) Assignee: The Regents of The University of California, Oakland, CA (US)

( * ) Notice: Subject to any disclaimer, the term of this patent is extended or adjusted under 35 U.S.C. 154(b) by 1520 days.

This patent is subject to a terminal disclaimer.

(21) Appl. No.: 10/392,668

(22) Filed: Mar. 18, 2003

(65) Prior Publication Data

US 2003/0226498 A1    Dec. 11, 2003

Related U.S. Application Data

(60) Provisional application No. 60/365,401, filed on Mar. 19, 2002, provisional application No. 60/381,660, filed on May 17, 2002, provisional application No. 60/381,667, filed on May 17, 2002.

(51) Int. Cl.
    *H01L 31/00* (2006.01)

(52) U.S. Cl. .................. 257/615; 257/613; 257/614; 117/903; 117/921; 117/956

(58) Field of Classification Search ................ 257/613, 257/614, 615; 117/903, 921, 956
See application file for complete search history.

(56) References Cited

U.S. PATENT DOCUMENTS

| | | | |
|---|---|---|---|
| 4,625,071 A | 11/1986 | Delahoy et al. | |
| 5,262,357 A | 11/1993 | Alivisatos et al. | |
| 5,331,183 A | 7/1994 | Sariciftci et al. | |
| 5,350,459 A | 9/1994 | Suzuki et al. | |
| 5,350,644 A | 9/1994 | Graetzel et al. | |
| 5,454,880 A | 10/1995 | Sariciftci et al. | |
| 5,504,323 A | 4/1996 | Heeger et al. | |
| 5,505,928 A | 4/1996 | Alivisatos et al. | |
| 5,523,555 A | 6/1996 | Friend et al. | |
| 5,525,440 A | 6/1996 | Kay et al. | |
| 5,537,000 A | 7/1996 | Alivisatos et al. | |

(Continued)

FOREIGN PATENT DOCUMENTS

EP    1087446 A1    3/2001

(Continued)

OTHER PUBLICATIONS

Manna et al. ("Synthesis of Soluble and Processable Rod, Arrow, Teardrop, and Tetrapod-shaped CdSe Nanocrystals"), J. Am. Chem. Soc. 2000, 122, pp. 12700-12706.*

(Continued)

*Primary Examiner*—Robert M Kunemund
*Assistant Examiner*—Matthew J Song
(74) *Attorney, Agent, or Firm*—Townsend and Townsend and Crew LLP

(57) ABSTRACT

The invention described herein provides for thin films and methods of making comprising inorganic semiconductor-nanocrystals dispersed in semiconducting-polymers in high loading amounts. The invention also describes photovoltaic devices incorporating the thin films.

46 Claims, 13 Drawing Sheets

U.S. PATENT DOCUMENTS

| | | | |
|---|---|---|---|
| 5,571,612 | A | 11/1996 | Motohiro et al. |
| 5,670,791 | A | 9/1997 | Halls et al. |
| 5,698,048 | A | 12/1997 | Friend et al. |
| 5,751,018 | A | 5/1998 | Alivisatos et al. |
| 5,804,836 | A | 9/1998 | Heeger et al. |
| 5,990,479 | A | 11/1999 | Weiss et al. |
| 6,013,871 | A | 1/2000 | Curtin |
| 6,057,561 | A | 5/2000 | Kawasaki et al. |
| 6,207,392 | B1 | 3/2001 | Weiss et al. |
| 6,225,198 | B1 | 5/2001 | Alivisatos et al. |
| 6,239,355 | B1 | 5/2001 | Salafsky |
| 6,277,740 | B1 | 8/2001 | Goldstein |
| 6,306,736 | B1 * | 10/2001 | Alivisatos et al. ........... 438/497 |
| 6,423,551 | B1 | 7/2002 | Weiss et al. |
| 6,440,213 | B1 | 8/2002 | Alivisatos et al. |
| 2001/0012572 | A1 * | 8/2001 | Araki ........................ 428/690 |
| 2002/0006723 | A1 | 1/2002 | Goldstein |
| 2002/0016306 | A1 | 2/2002 | Hutchison et al. |
| 2002/0040728 | A1 | 4/2002 | Yoshikawa |
| 2002/0192441 | A1 | 12/2002 | Kalkan et al. |
| 2004/0003838 | A1 | 1/2004 | Curtin |
| 2005/0133087 | A1 * | 6/2005 | Alivisatos et al. ........... 136/263 |

FOREIGN PATENT DOCUMENTS

| | | | |
|---|---|---|---|
| WO | WO 99/25028 | A1 | 6/1999 |
| WO | WO 00/70691 | A1 * | 11/2000 |
| WO | WO 02/101352 | A2 | 12/2002 |

OTHER PUBLICATIONS

Greenham et al ("Charge separation and transport in conjugated-polymer/semiconductor-nanocrystal composites studied by photoluminescence quenching and photoconductivity"), Physical Review B, vol. 54, No. 24, Dec. 1996, pp. 17628-17637.*
Hu et al., "Linearly Polarized Emission from Colloidal Semiconductor Quantum Rods", Science, vol. 292, Jun. 2001, pp. 2060-2063.*
Alivisatos, "Perspectives on the physical chemisty of semiconductor nanocrystals", J. Phys. Chem. 1996, 100, p. 13226-13239.*
Gebeyehu, D. et. al., "Solid State Dye-Sensitized TI02 Solar Cells with Poly (3-Octylthiophene) as Hole Transport Layer," *Synthetic Metals, Elsevier Sequoia*, Lausanne, Ch., (Mar. 15, 2003), vol. 121, No. 1-3, pp. 1549-1550, XP001023523 ISSN: 0379-6779.
Huynh, W.U., et al., "CDSE Nanocrystal Rods/Poly (3-Hexylthiophene) Composite Photovoltaicdevices," *Proceedings of the International Symposium Photovoltaics for the 21st Century*. Seattle, Wa. (May 1999) *Electrochemical Society Proceedings*, vol. 99-11, Pennington, NJ: *Electrochemical Soc.*, US, vol. Meeting 195, May 1999, pp. 86-90, XP000994065 ISBN: 1-56677-233-8.
Kymakis, E., et al., "Single-Wall Carbon Nanotube/Conjugated Polymer Photovoltaic Devices," *Applied Physics Letters, AIP, American Institute of Physics*, Melville, NY, US, (Jan. 7, 2002), vol. 80, No. 1, pp. 112-114, XP012030193.
Colvin, V.L., et al., "Electric Field Modulation Studies of Optical Absorption in CdSe Nanocrystals: Dipolar Character of the Excited State," *J. Chem. Phys.*, (Oct. 15, 1994), vol. 101, No. 8, pp. 7122-7138.
Alivisatos, Paul, "Colloidal Quantum Dots. From Scaling Laws to Biological Applications," *Pure Appl. Chem.*, 2000, vol. 72, pp. 3-9.
Schlamp, et al., *J. Appl. Phys.* 82 (11), pp. 5837-5842, (Dec. 1997).
Sirringhaus, et al., *Science*, vol. 280, pp. 1741-1744, (Jun. 1998).
Peng, et al., *J. Am. Chem. Soc.*, vol. 123, pp. 183-184, (2001).
Manna, et al., *J. Am. Chem. Soc.*, vol. 122, pp. 12700-12706, (2000).
Shaheen, et al., *Applied Physics Letters*, vol. 78, No. 6, pp. 841-843, (Feb. 2001).
Dittmer, et al., *Advanced Materials*, vol. 12, No. 17, pp. 1270-1274, (Sep. 2000).
Arango, et al., *Advanced Materials*, vol. 12, No. 22, pp. 1689-1692, (Nov. 2000).
Alivisatos, *Science*, vol. 271, pp. 933-936, (Feb. 1996).
Winiarz, et al., *Chemical Physics*, vol. 245, pp. 417-428, (1999).
Schmidt-Mende et al., *Reports*, (2001), 'Self Organized Discotic Liquid Crystals for High-Efficiency Organic Photovoltaics'.
Yu, et al., *J. Appl. Phys.*, pp. 4510-4515, (Oct. 1995).
Halls, et al., *Nature*, vol. 376, p. 498-500, (Aug. 1995).
Schon, et al., *Nature*, vol. 403, (Jan. 2000).
Roman, et al., *Advanced Materials*, vol. 9, No. 15, pp. 1164-1168, (1997).
Roman, et al., *Advanced Materials*, vol. 10, No. 10, pp. 774-777-1168, (1998).
Granstrom, et al., *Synthetic Metals*, vol. 102, pp. 957-958, (1999).
Gao, et al., *Advanced Materials*, vol. 10, No. 9, pp. 692-695, (1998).
Zhang, et al., *Advanced Materials*, vol. 13, No. 24, pp. 1871-1874, (Dec. 2001).
Hiramoto, et al., *Appl. Phys. Lett.*, vol. 73, No. 18, pp. 2627-2629, (Nov. 1998).
Abdou, et al., *J. Am. Chem. Soc.*, vol. 119, pp. 4518-4524, (1997).
Halls, et al., *Phys. Rev. B*, vol. 60, No. 8, pp. 5721-5726, (1999).
Yu, et al., *Appl. Phys. Lett.* 64 (25), (Jun. 1994).
Yu, et al., *Appl. Phys. Lett.* 64 (12), pp. 1540-1542, (Mar. 1994).
Tang, *Appl. Phys. Lett.* 48 (2), pp. 183-185, (Jan. 1986).
Halls, et al., *Appl. Phys. Lett.* 68 (22), pp. 3120-3122, (May 1996).
Park, et al., *Synthetic Metals*, vol. 79, pp. 177-181, (1996).
Yoshino, et al., *IEEE Transactions on Electron Devices*, vol. 44, No. 8, (Aug. 1997).
Harrison, et al., *Phys. Rev. B*, vol. 55, No. 12, pp. 7831-7849, (1997).
Gao, et al., *Synthetic Metals*, vol. 84, pp. 979-980, (1997).
Tada, et al., *Jpn. J. Appl. Phys.*, vol. 36, Part 2, No. 3A, pp. L306-L309, (Mar. 1997).
Tada, et al., *Synthetic Metals*, vol. 85, pp. 1305-1306, (1997).
Kohler, *Nature*, vol. 392, p. 903-906, (Apr. 1998).
Ginger, et al., *Appl. Phys. Lett.*, vol. 59, No. 16, pp. 10622-10629, (1999).
Sharma, et al., *Optical Materials*, vol. 13, pp. 261-265, (1999).
Kasam, *Journal of Materials Science*, vol. 34, pp. 5237-5242, (1999).
Ouali, et al., "Oligo(phenylenevinylene)/Fullerene Photovoltaic Cells: Influence of Morphology", *Advanced Materials*.
Chartier, *Solar Energy Materials & Solar Cells*, vol. 52, pp. 413-421, (1998).
Greenham, et al., *Phys. Rev. B*, vol. 54, No. 24, pp. 17628-17637, (1996).
Peng, "High Quality Inorganic Semiconductor Nanocrystals for New Solar Cells", pp. 1-8.
Zaban, *Langmuir*, vol. 14, pp. 3153-3156, (1998).
Gratzel, *MRS Bulletin*, pp. 61-66, (Oct. 1993).
Li, et al., *Synthetic Metals*, vol. 94, pp. 273-277, (1998).
Kavan, et al., *J. Phys. Chem.*, vol. 97, pp. 9493-9498, (1993).
Nazeeruddin, et al. *J. Am. Chem. Soc.*, vol. 115, pp. 6382-6390, (1993).
Huang, et al., *J. Phys. Chem. B*, vol. 101, pp. 2576-2582, (1997).
Bach, et al., *Nature*, vol. 395, pp. 583-585, (Oct. 1998).
Smestad, et al., *Journal of Chemical Education*, vol. 75, No. 6, pp. 752-756, (Jun. 1998).
Vogel, et al., *J. Phys. Chem.*, vol. 98, pp. 3183-3188, (1994).
O'Regan, et al., *Nature*, vol. 353, pp. 737-740, (Oct. 1991).
Granstrom, et al., *Nature*, vol. 395, pp. 257-260, (Sep. 1998).
Marks, et al., *J. Phys.: Condens. Matter*, vol. 6, pp. 1379-1393, (1994).
Petritsch, et at., *Solar Energy Materials & Solar Cells*, vol. 61, pp. 63-72, (2000).
Dittmer, et al., *Solar Energy Materials & Solar Cells*, vol. 61, pp. 53-61, (2000).
Krasnikov, et al., *Department of Polymer Chemistry, Materials Science Centre, University of Groningen: Infosheet 'Interpenetrating Morphologies for Photovoltaic Devices'*.
Halls, et al., *Synthetic Metals*, vol. 85, pp. 1307-1308, (1997).
Roman, et al., *Advanced Materials*, vol. 12, Issue 3, pp. 189-195, (2000).
Yu, et al., *Science*, vol. 270, pp. 1789-1791, (Dec. 1995).
Huynh, "*Nanocrystal-Polymer Solar Cells*", (May 2002) Dissertation U.C. Berkeley Chemistry Department, pp. 1-196.
Ahmadi, et al., *Science*, vol. 272, pp. 1924-1926, (Jun. 28, 1996).
Alivisatos, J. Phys. Chem., vol. 100, *American Chemical Society*, pp. 13226-13239, (1996).

Ataev, et al., Tech. Phys. Lett., vol. 23, No. 11, *American Institute of Physics*, pp. 842-843, (Nov. 1997).
Bandaranayake, et al., Appl. Phys. Lett., vol. 67, No. 6, *American Institute of Physics*, pp. 831-833, (Aug. 7, 1995).
Berman, et al., *Science*, vol. 269, pp. 515-518, (Jul. 28, 1995).
Chang, et al., Langmuir, vol. 15, *American Chemical Society*, pp. 701-709, (1999).
Chemseddine, et al., *Eur. J. Inorg. Chem., Wiley-VCH Verlag GmbH*, pp. 235-245, (1999).
Chen, et al., Chem. Mater., vol. 12, *American Chemical Society*, pp. 1516-1518, (2000).
Cho, Journal of Crystal Growth, 201/202, *Elsevier Science B.V.* pp. 1-7, (1999).
Cui, et al., *Science*, vol. 293, pp. 1289-1292, (Aug. 17, 2001).
Dai, et al., Chemical Physics Letters, vol. 358, *Elsevier Science B.V.*, pp. 83-86, (May 24, 2002).
Holmes, et al., *Science*, vol. 287, pp. 1471-1473, (Feb. 25, 2000).
Hu, et al., Acc. Chem. Res., vol. 32, No. 5, *Accounts of Chemical Research*, pp. 435-445, (1999).
Huynh, et al., Advanced Materials, vol. 11, No. 11, *Wiley-VCH Verlag GmbH*, pp. 923-927, (1999).
Huynh, et al., *Science*, vol. 295, pp. 2425-2427, (Mar. 25, 2002).
Ito, Jpn. J. Appl. Phys., vol. 37, Part 2, No. 10B, *Publication Board, Japanese Journal of Applied Physics*, pp. L1217-L1220, (Oct. 15, 1998).
Jin, et al., , Science, vol. 294, pp. 1901-1903, (Nov. 30, 2001).
Jun, et al., J. Am. Chem. Soc., vol. 123, *American Chemical Society*, pp. 5150-5151, (2001).
Leon, et al., *Science*, vol. 267, pp. 1966-1968, (Mar. 31, 1995).
Li, et al., Nature, vol. 402, *Macmillan Magazines Ltd.*, pp. 393-395, (Nov. 25, 1999).
Lieber, Solid State Communications, vol. 107, No. 11, *Elsevier Science Ltd.*, pp. 607-616, (1998).
Liu, et al., Physical Review Letters, vol. 84, No. 9, *The American Physical Society*, pp. 1958-1961, (Feb. 28, 2000).
Mews, et al., Physical Review B, vol. 53, No. 20, *The American Physical Society*, pp. R13 242-R13 245, (May 15, 1996).
Murray, et al., J. Am. Chem. Soc., *American Chemical Society*, pp. 8706-8715, (1993).
Ni, et al., Chem. Mater., vol. 14, *American Chemical Society*, pp. 1048-1052, (2002).
Park, et al., Physical Review B, vol. 49, No. 7, *The American Physical Society*, pp. 4485-4493, (Feb. 15, 1994).
Park, et al., J. Am. Chem. Soc., vol. 122, *American Chemical Society*, pp. 8581-8582, (2000).
Paul, Advanced Materials, vol. 11, No. 3, *Wiley-VCH Verlag GmbH*, pp. 191-204, (1999).
Peng, et al., J. Am. Chem Soc., vol. 120, *American Chemical Society*, pp. 5343-5344, (1998).
Peng, et al., J. Am. Chem. Soc., vol. 124, *American Chemical Society*, pp. 3343-3353, (2002).
Peng, et al., Nature, vol. 404, *Macmillan Magazines Ltd.*, pp. 59-61, (Mar. 2, 2000).
Penn, et al., *Science*, vol. 281, pp. 969-971, (Aug. 14, 1998).
Qi, et al., J. Phys. Chem. B, vol. 101, *American Chemical Society*, pp. 3460-3463, (1997).
Rees, et al., vol. 15, *American Chemical Society*, pp. 1993-2002, (1999).
Satoh, et al., Jpn. J. Appl. Phys., vol. 38, Part 2, No. 58, *Publication Board, Japanese Journal of Applied Physics*, pp. L586-L589, (May 15, 1999).
Shevchenko, et al., Advanced Materials, vol. 14, No. 4, *Wiley-VCH Verlag GmbH*, pp. 287-290, (Feb. 19, 2002).
Smalley, et al., Solid State Communications, vol. 107, No. 11, *Elsevier Science Ltd.*, pp. 597-606, (1998).
Tanori, et al., Langmuir, vol. 13, *American Chemical Society*, pp. 639-646, (1997).
Trentler, et al., *Science*, vol. 270, pp. 1791-1794, (Dec. 15, 1995).
Wang, et al., *Science*, vol. 293, pp. 1455-1457, (Aug. 24, 2001).
Yeh, et al., Physical Review B, vol. 45, No. 20, *The American Physical Society*, pp. 12 130-12 133, (May 15, 1992).
Yeh, et al., Physical Review B, vol. 46, No. 16, *The American Physical Society*, pp. 10 086-10 097, (Oct. 15, 1992).
Yu, et al., The Journal of Physical Chemistry B, vol. 101, No. 34, *American Chemical Society*, pp. 6661-6664, (Aug. 21, 1997).
Zhou, et al., Materials Research Bulletin, vol. 34, Nos. 10/11, *Elsevier Science Ltd.*, pp. 1563-1567, (199), 1999.
Zhou, et al., Journal of Applied Polymer Science, vol. 80, *John Wiley & Sons, Inc.*, pp. 1520-1525, (2001).
Cerullo, et al, in: *Summaries of Papers at the Quantum and Laser Science Conference, QELS '96.* New York: IEEE, pp. 167-168, Jun. 2-7, 1996.
Office Action Mailed Jun. 13, 2008 relating to corresponding Japanese Patent Application No. 2003-579291, filed Mar. 19, 2003.
"Communication pursuant to Article 94(3) EPC" dated Apr. 6, 2010 for EP 037142199.9, dated Apr. 6, 2010 (4 pages).

* cited by examiner

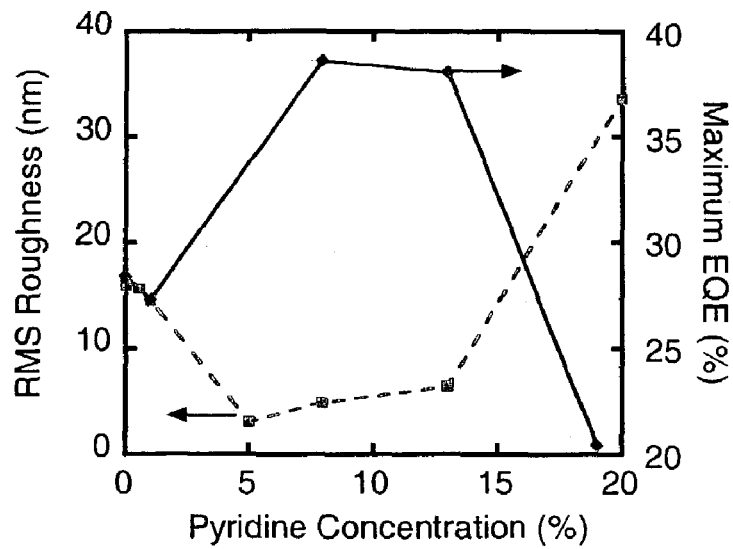
FIG 6
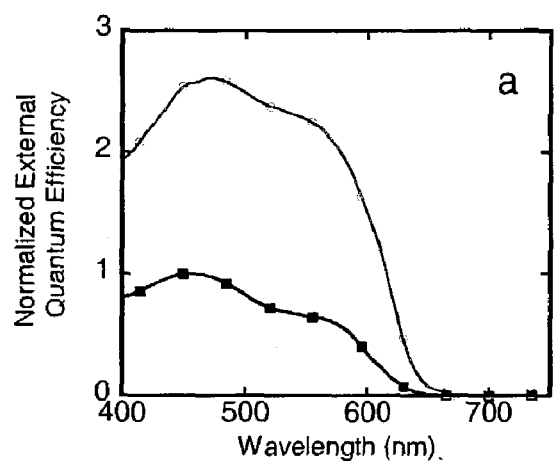
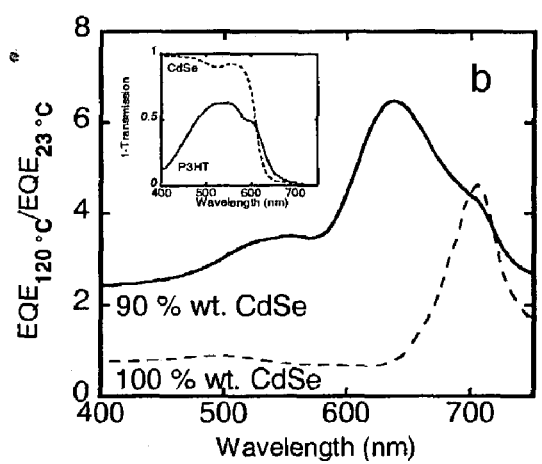
FIG 7a                    FIG 7b

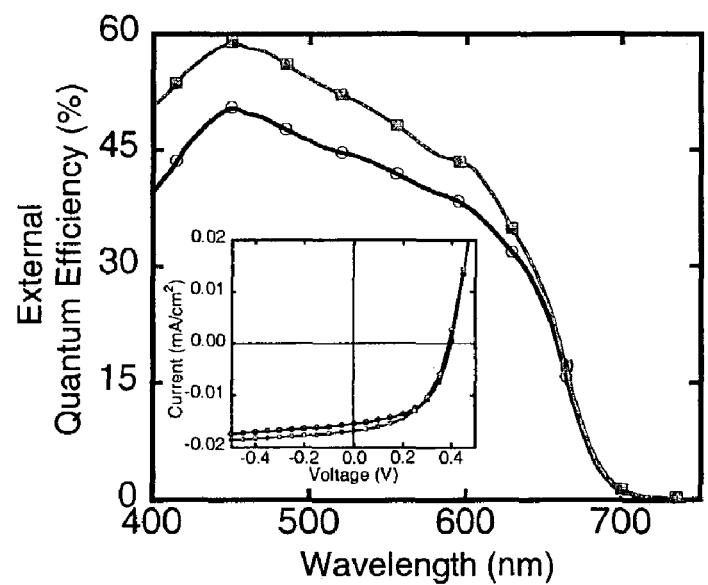
FIG 10
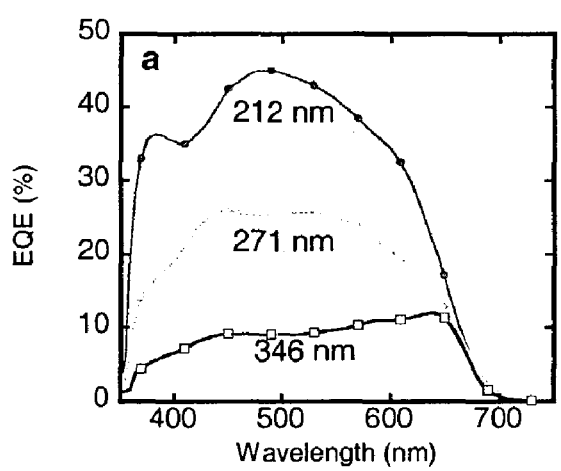 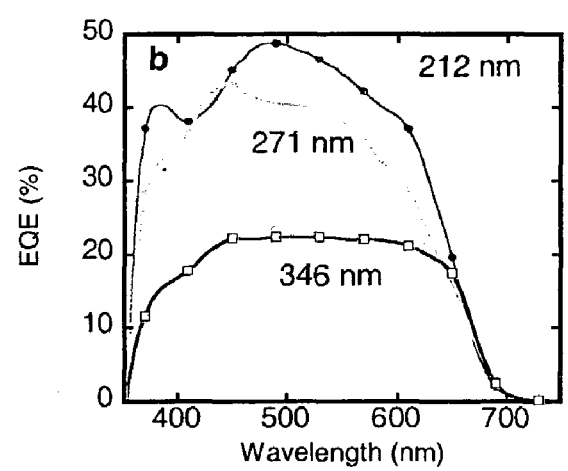
FIG 11a  FIG 11b

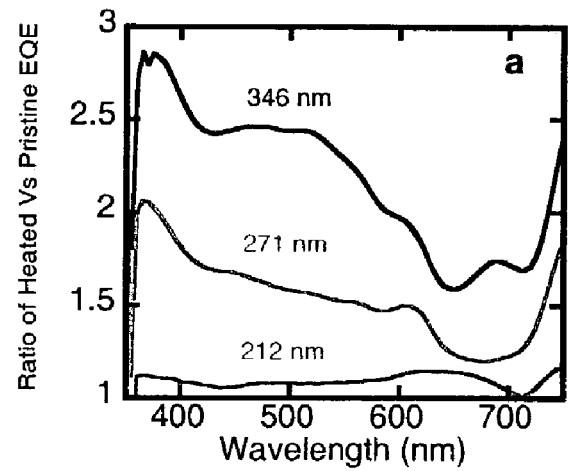
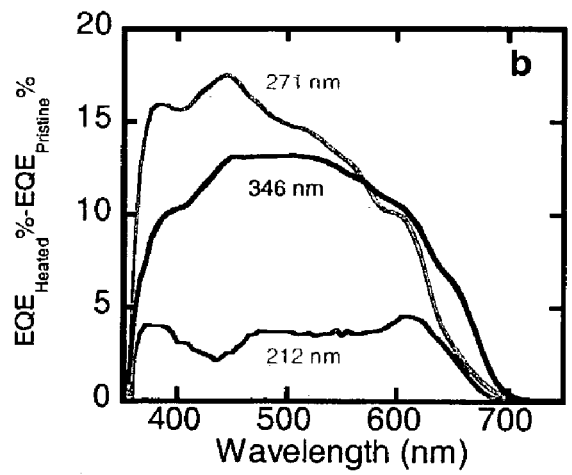
FIG 12a  FIG 12b
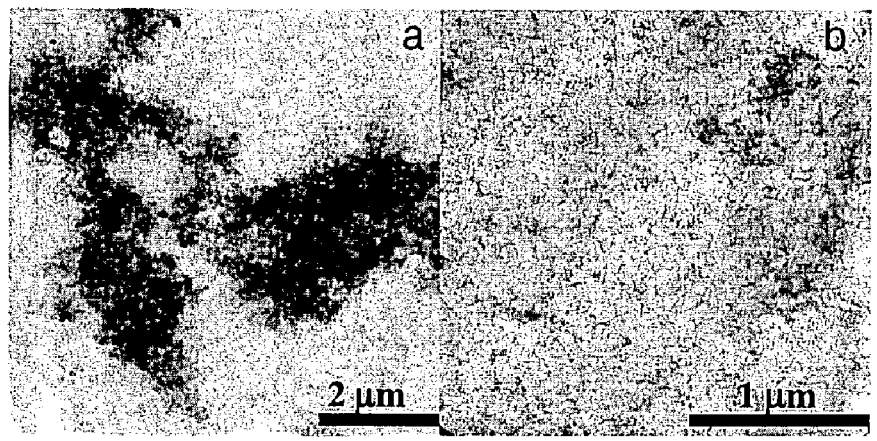
FIG 13a  FIG 13b

SEMICONDUCTOR-NANOCRYSTAL/CONJUGATED POLYMER THIN FILMS

CROSS-REFERENCES TO RELATED APPLICATIONS

This application is a non-provisional application based on U.S. Provisional Patent Application Nos. 60/365,401, filed Mar. 19, 2002; 60/381,660, filed May 17, 2002 and 60/381,667, also filed on May 17, 2002. These U.S. Provisional Patent Applications are herein incorporated by reference in their entirety for all purposes. Copending U.S. patent applications are U.S. Ser. No. 10/301,510, filed Nov. 20, 2002, which claims priority to U.S. Ser. No. 60/335,435, filed Nov. 30, 2001; and U.S. Ser. No. 10/280,135, which claims priority to U.S. Ser. Nos. 60/395,064, filed Jul. 12, 2002 and 60/346,253, filed Oct. 24, 2001. The contents of both utility applications and all provisional applications are incorporated by reference in their entirety for all purposes.

STATEMENT AS TO RIGHTS TO INVENTIONS MADE UNDER FEDERALLY SPONSORED RESEARCH OR DEVELOPMENT

The invention described and claimed herein was made in part utilizing funds supplied by the United States Department of Energy under contract NO. DE-AC03-76SF000-98 between the United States Department of Energy and The Regents of the University of California. The government has certain rights to the invention.

BACKGROUND OF THE INVENTION

The first solar cells were fabricated in the mid 1950s from crystalline silicon wafers. At that time, the most efficient devices converted 6% of solar power to electricity. Advancements in solar cell technology over the past 50 years have resulted in the most efficient Si cell at 25% and commercial Si modules, an array of cells, at 10%. Although Si, in crystalline and polycrystalline forms, is the most common type of material used in solar cells, other semiconductors such as gallium arsenide, indium phosphide and cadmium telluride are being investigated for the next generation of higher efficiency solar cells. In particular, high efficiency structures such as tandem cells, in which multiple band gaps are layered in a single device, using GaInP, GaAs and Ge have attained record efficiencies of 34%.

Despite these impressive efficiencies, the high cost of manufacturing solar cells of the prior art limits their widespread use as a source of power. The construction of prior art commercial silicon solar cells involves four main processes: the growth of the semiconductor material, separation into wafers, formation of the device and its junctions, and encapsulation. For the cell fabrication alone, thirteen steps are required to make the solar cell and of these thirteen steps, five require high temperatures (300° C.-1000° C.), high vacuum or both. In addition, the growth of the semiconductor from a melt is at temperatures above 1400° C. under an inert argon atmosphere. To obtain high efficiency devices (>10%), structures involving concentrator systems to focus sunlight on to the device, multiple semiconductors and quantum wells to absorb more light, or higher performance semiconductors such as GaAs and InP, are needed. The gain in performance results in increased manufacturing costs, which stem from the multiplication of the number of fabrication steps. To date, these high performance architectures have been employed mainly for extra-terrestrial applications such as in space shuttles and satellites, where efficiency per unit weight is as important as fabrication costs.

Another problem with the solar devices of the prior art is the high cost of manufacturing materials. The amount of silicon needed for 1 kW of module output power is approximately 20 kg. At $20/kg, the material costs for electronic grade silicon is partially subsidized by the chip manufacturing sector. Other materials such as GaAs, which are synthesized with highly toxic gases, are a factor of 20 higher in cost at $400/kg. Because solar cells are large area devices, such material costs hinder the production of inexpensive cells. As a result, thin film devices, which have active layers several microns thick of amorphous Si, CdTe, and $CuInSe_2$ are being explored. In 1991, O'Regan et al. reported the invention of a novel photochemical solar cell comprised of inexpensive $TiO_2$ nanocrystals and organic dye, O'Regan et al. *Nature* 353, 737 (1991).

Bilayer devices, from spin casting a derivative of polythiophene on which a layer of $C_{60}$ is evaporated, have been able to reach a maximum external quantum efficiency (EQE) of 23%. Higher efficiencies at 50% were obtained from blending derivatives of $C_{60}$ and MEH-PPV into a homogeneous film for a single-layer device. Further improvements in efficiencies are limited by the poor electron transport properties of $C_{60}$, which is characterized by hopping, and the low overlap between the device absorption and the solar emission spectrum, Greenham. N. C. et al., *Phys Rev. B*, Vol. 54, No. 24, December 1996.

It has been suggested previously to use CdSe particles in poly(3-hexylthiophene), see Alivisatos et al. *Adv. Mater.* 1999, 11, No. 11. This work only teaches the use of nanocrystals less than 13 nm in size and the devices produced do not approach the efficiencies of those of the instant invention. Further, this prior art admits solution chemistry problems with nanorods and offers no solutions to the problems solved by the invention described herein. Solar cells based on inorganic nanorods according to the instant invention, which have good transport properties and absorption spectra that can also be extended into the near infrared, can potentially reach efficiencies that rival conventional solar cells based on bulk inorganic semiconductors. It is the thin films incorporating semiconductor-nanocrystals according to the embodiments of this invention that provide solutions to the above stated problems.

SUMMARY OF THE INVENTION

The invention described herein provides for thin films and methods of making comprising inorganic semiconductor-nanocrystals dispersed in semiconducting-polymers in high loading amounts. The invention also describes photovoltaic devices incorporating the thin films.

BRIEF DESCRIPTION OF THE DRAWINGS

FIG. 6 shows surface roughness (open circles) of films consisting of 90 wt. % 9 nm by 13 nm CdSe nanocrystals dispersed in P3HT spin cast from various concentrations of pyridine in chloroform. The maximum EQE (solid diamonds) is shown of devices made from these films. Lines serve as a guide to the eye.

FIG. 7a shows a normalized photocurrent spectra for a 90 wt. % 3 nm by 60 nm CdSe nanorods in P3HT device (open circles) and after annealing at 120° C. (solid squares).

FIG. 7b shows the ratio of the EQE before and after heat treatment as a function of wavelength for 90 wt. % 3 nm by 60 nm CdSe nanorods in P3HT device and a nanorod-only device. The inset shows the individual 1-transmission spectra for 3 nm by 60 nm CdSe and P3HT.

FIG. 10 shows the EQE spectra of a 90 wt. % 7 nm by 60 nm CdSe nanorods in P3HT (open circles) and after 120° C. heat treatment (solid squares). Inset: the corresponding current-voltage characteristics, under illumination of 0.1 mW/cm$^2$ at 515 nm, for this device, which includes an open circuit voltage of 0.4 V and a fill factor of 0.5.

FIG. 11a shows the EQE spectra of devices from 90 wt. % 7 nm by 60 nm CdSe nanorods in P3HT with thickness 212 nm, 271 nm and 346 nm before 120° C. heat treatment.

FIG. 11b shows the EQE spectra of devices from 90 wt. % 7 nm by 60 nm CdSe nanorods in P3HT with thickness 212 nm, 271 nm and 346 nm after 120° C. heat treatment.

FIG. 12a shows the relative enhancement of the EQE before and after heating at 120° C. for devices in FIGS. 11a and 11b.

FIG. 12b shows the absolute difference in EQE before and after heat treatment.

FIG. 13a shows a TEM of a thin film of 20 wt. % 3 nm by 60 nm CdSe nanorods and P3HT spin cast from chloroform.

FIG. 13b shows a TEM of the same nanocrystals of FIG. 13a when cast from a 10 vol. % pyridine in chloroform solution.

FIG. 22a shows a TEM of 40 wt % 5 nm CdSe nanocrystals in P3HT for pyridine treated nanocrystals.

DETAILED DESCRIPTION OF THE PREFERRED EMBODIMENTS

Figure 1:
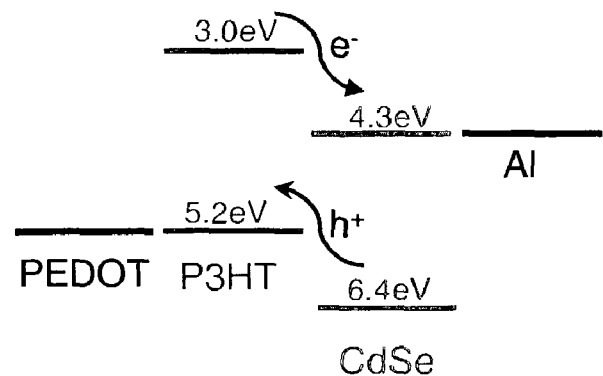
FIG. 1 shows an energy level diagram for CdSe and P3HT which shows a schematic of process of charge transfer between 5 nm CdSe and P3HT.

In one embodiment of the invention there is disclosed a thin film comprising a semiconducting conjugated polymer having at least 5 wt % semiconductor-nanocrystals embedded therein.

In another embodiment there is disclosed a photovoltaic device comprising the thin film of this invention.

In another embodiment of this invention there is disclosed a process of making a polymeric thin film comprising washing surfactant coated semiconductor-nanocrystals with a solvent at least one time, and codissolving the washed semiconductor-nanocrystals and a semiconducting polymer in a binary solvent mixture, and depositing the mixture.

In another embodiment of the invention there is disclosed process of making a photoactive thin film comprising dispersing semiconductor-nanocrystals having an aspect ratio of greater than 2 in a semiconducting conjugated polymer to provide a polymer-nanocrystal composite, and depositing a thin film of said composite, such that the nanocrystals are embedded in the polymer at greater than 5 wt %.

In another embodiment of the invention there is disclosed a photovoltaic device, comprising a conjugated conductive polymeric layer having semiconductor-nanocrystals dispersed therein where the device has an power conversion efficiency greater than 1% at AM 1.5 global illumination.

In another embodiment of the invention there is disclosed a photovoltaic device comprising a first planar electrode, a thin film comprising a semiconducting conjugated polymer having semiconductor-nanocrystals embedded therein, the thin film being deposited on the first planar electrode, and a second electrode opposite the first electrode, and a hole injecting layer disposed between the thin film polymeric layer and the first planar electrode.

In preferred embodiments of this invention the semiconductor-nanocrystals will have an aspect ratio of greater than 2, preferably greater than 5, more preferably between about 5 and 50. Most preferred is about 10.

In preferred embodiments of this invention there is disclosed the dispersion or embedding of semiconductor-nanocrystals in the semiconducting-polymer. Preferably this "loading" is on the amount of greater than 5 wt %. More preferably, this amount is between 20 and about 95 wt %. Even more preferably the amount is between 50 and about 95 wt %. Most preferably the amount is about 90 wt %.

In preferred embodiments of this invention the semiconducting polymer will be a polymer or blend chosen from trans-polyacetylenes, polypyrroles, polythiophenes, polyanilines, poly(p-phenylene)s and poly(p-phenylene-vinylene)s, polyfluorenes, polyaromatic amines, poly(thienylene-vinylene)s and soluble derivatives thereof. Preferred are (poly (2-methoxy5-(2'-ethylhexyloxy)p-phenylenevinylene) (MEH-PPV) and poly(3-hexylthiophene, (P3HT), with P3HT being the most preferred.

In preferred embodiments, the semiconductor-nanocrystals comprise rods having lengths greater than about 20 nm. More preferred are rods having a length of between 20 and 200 nm. Even more preferred are rods having lengths of between about 60 and 110 nm.

In more preferred embodiments the invention discloses the use of Group II-VI, Group III-V, Group IV semiconductors and tertiary chalcopyrites. More preferred are CdSe, CdTe, InP, GaAs, CuInS2, CuInSe2, AlGaAs, InGaAs, Ge and Si, and even more preferred is CdSe.

It is preferred that the semiconductor nanocrystals be branched nanocrystals. More preferred nanocrystals having 4 arms and tetrahedral symmetry.

It is preferred that the thin film of this invention have a thickness of about 200 nm.

It is preferred that the process for making the thin film of this invention use a binary solvent mixture where at least one of the solvents is chosen from the group consisting pyridine, chloroform, toluene, xylenes, hexanes, water, dichlorobenzene, methylene chloride, an alkylamine, where the alkyl chain may be branched or unbranched and is between 2 and 20 carbons in length, butanol, methanol and isopropanol. Most preferred is pyridine in chloroform.

It is preferred that the binary solvent mixture be in an amount of between 1-15 vol %, with a more preferred range being 4-12 vol %, and most preferred is 8 vol %.

In another embodiment of the invention described herein there is disclosed a method for making polymeric thin films having incorporated therein semiconductor nanocrystals where there is a step of washing the surfactant coated semiconductor nanocrystals at least once with a solvent, preferred in pyridine.

In another embodiment of the invention described herein is a method for making a polymeric thin film comprising thermal annealing of the deposited film at a temperature of from 60° C. to about 200° C. Preferred is about 120° C.

In another embodiment of the invention there is disclosed herein a photovoltaic device incorporating a PEDOT:PSS (poly(ethylene-dioxy)thiophene:poly(styrene sulphonic acid)) hole transporting layer on top of an ITO electrode.

By "semiconductor-nanocrystal" it is meant to include semiconducting crystalline particles of all shapes and sizes. Preferably, they have at least one dimension less than about 100 nanometers, but they are not so limited. Rods may be of any length. "Nanocrystal", "nanorod" and "nanoparticle" can and are used interchangeably herein. In some embodiments of the invention, the nanocrystal particles may have two or more dimensions that are less than about 100 nanometers. The nanocrystals may be core/shell type or core type. For example, some branched nanocrystal particles according to some embodiments of the invention can have arms that have aspect ratios greater than about 1. In other embodiments, the arms can have aspect ratios greater than about 5, and in some cases, greater than about 10, etc. The widths of the arms may be less than about 200, 100, and even 50 nanometers in some embodiments. For instance, in an exemplary tetrapod with a core and four arms, the core can have a diameter from about 3 to about 4 nanometers, and each arm can have a length of from about 4 to about 50, 100, 200, 500, and even greater than about 1000 nanometers. Of course, the tetrapods and other nanocrystal particles described herein can have other suitable dimensions. In embodiments of the invention, the nanocrystal particles may be single crystalline or polycrystalline in nature. The invention also contemplates using nanorods of CdSe and CdTe that have have aspect ratios above 20, even up to 50, and lengths greater than 100 nm, formed according to processes described in the literature, see Peng, X. G. et al. *Nature* 404, 59 (2000) and Peng, Z. A. et al. *J. Am. Chem Soc.* 123, 183 (2001).

The length of semiconductor-nanocrystal rods used herein have lengths between 20 and 200 nm. In preferred embodiments, the semiconductor-nanocrystals comprise rods having lengths greater than about 20 nm. More preferred are rods having a length of between 20 and 200 nm. Even more preferred are rods having lengths of between about 60 and 110 nm.

By "at least a portion of the semiconductor-nanocrystals have an aspect ratio greater than about 2" it is meant that if the semiconductor-nanocrystals are unbranched rods, then at least part of the total amount of the rods will have an aspect ratio of greater than about 2. The amount could be as high as 100%. Also, this means that if the nanocrystals are branched semiconductor-nanocrystals (which of course includes tetrapods), then "at least a portion" means that at least one branch has an aspect ratio of greater than 2. Aspect ratio is defined as the length of the longest dimension of a rod divided by its diameter. In the case of a branched nanocrystal, the aspect ratio for the branched nanocrystal is defined as the length of the longest branch divided by the longest branches diameter.

By "a portion of the semiconductor-nanocrystals are branched nanocrystals" it is meant that at least 1% by weight of the nanocrystals are branched nanocrystals. It is understood that the language "a portion" as defined herein could also include 100%, i.e. the "whole portion".

Although CdSe and CdTe semiconductor-nanocrystals are preferred, the nanocrystal particles may comprise other suitable semiconductor material, and be a rod, a shaped particle or a sphere. For example, the particles may comprise semiconductors such as compound semiconductors. Suitable compound semiconductors include Group II-VI semiconducting compounds such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe. Other suitable compound semiconductors include Group III-V semiconductors such as GaAs, GaP, GaAs—P, GaSb, InAs, InP, InSb, AlAs, AlP, AlGaAs, InGaAs and AlSb. The use of Group IV semiconductors such as germanium or silicon may also be feasible under certain conditions. In other embodiments, the particles may comprise a dielectric material such as SiC, SiN or any other material that can exhibit polytypism. Also included are the tertiary chalcopyrites, for example $CuInS_2$ and $CuInSe_2$. Some metals such as Fe, Ni, Cu, Ag, Au, Pd, Pt, Co and others may also exhibit polytypism and can be used in embodiments Rod, Arrow, Teardrop and tetrapod shaped semiconductor nanocrystals are defined in Manna et al. *J. Am.*

Chem. Soc. 2000, 12, 12700-12706, the contents of which are hereby incorporated by reference for all purposes.

The nanocrystal particles according to embodiments of the invention can have unique optical, electrical, magnetic, catalytic, and mechanical properties, and can be used in a number of suitable end applications. They can be used, for example, as fillers in composite materials, as catalysts, as functional elements in optical devices, as functional elements in photovoltaic devices (e.g., solar cells), as functional elements in electrical devices, etc.

By "P3HT" it is meant poly(3-hexylthiophene), which includes regioregular P3HT, which includes head to head and also head to tail regioregular P3HT. Preferred is head to tail P3HT.

This invention contemplates that any semiconducting conjugated polymers that can be processed from solution will function in accordance with this invention. By "semiconducting polymer" it is meant all polymers that have a pi-electron system. Non-limiting examples include trans-polyacetylene, polypyrrole, polythiophene, polyaniline, poly(p-phenylene and poly(p-phenylene-vinylene), polyfluorenes, polyaromatic amines, poly(thienylene-vinylene)s and soluble derivatives of the above. An example is (poly(2-methoxy,5-(2'-ethylhexyloxy)p-phenylenevinylene)(MEH-PPV) and poly (3-alkylthiophene). Especially preferred is poly(3-hexylthiophene), P3HT. This invention also contemplates using conjugated polymers that are either solution processable or melt processable because of bulk pendant groups attached to the main conjugated chain or by its inclusion of the conjugated polymer into a copolymer structure of which one or more components are non-conjugated. Non-limiting examples include poly(,4'-diphenylenediphenylvinylene), poly(1,4-phenylene-1-phenylvinylene and poly(1,4-phenylenediphenylvinylene, poly(3-alkylpyrrole) and poly(2,5-dialkoxy-p-phenylenevinylene). It is understood that by semiconducting conjugated polymer this could mean a mixture of blend of polymers, one of which is to be a semiconducting conjugated polymer. Thus the nanocrystals are or would be embedded or dispersed in the blend or mixture.

This invention further contemplates that the semiconducor-nanocrystals, rods, can be aligned by any techniques known in the art for aligning crystals.

By "photovoltaic device" it is meant to include those typical device architectures known in the art. Exemplary photovoltaic devices are described in, for example, *Science*, Vol. 295, pp. 2425-2427, Mar. 29, 2002, the contents of which are incorporated by reference. An exemplary photovoltaic device may have nanocrystal particles in a binder. This combination can then be sandwiched between two electrodes (e.g., an aluminum electrode and an indium tin oxide electrode) on a substrate to form a photovoltaic device.

By "binary solvent system" it is meant to include a system of two solvents, and one may be a ligand that is also a solvent. For example, pyridine in chloroform. "Binary solvent system" is also meant to include a system of at least one solvent, and a ligand that is not a solvent, for example xylene and phosphonic acid. Xylene is a solvent for the semiconductor nanocrystal and phosphonic acid is a ligand, but not a solvent.

Suitable methods for making thin films like those described herein are known. Non-limiting examples of various coating and printing techniques from solution include spin coating, blade coating, dip coating, inkjet printing and screen printing. All of these techniques are generally referred to herein as "depositing". That is, the thin films of the instant invention have to be "deposited" onto a substrate of some form.

The complementary electronic properties of inorganic and organic semiconductors can be used in the formation of electrically active junctions. Charge transfer is favored between high electron affinity inorganic semiconductors and relatively low ionization potential organic molecules and polymers. In one embodiment of the instant invention semiconductor nanoparticles, such as CdSe nanocrystals are combined with conjugated polymers such as P3HT to create charge transfer junctions with high interfacial area resulting in photovoltaic devices having improved efficiency. From the energy level diagrams for CdSe nanocrystals and P3HT, it can be seen that CdSe is electron-accepting and P3HT is hole-accepting (FIG. 1). The presence of ligands on the surface of nanocrystals mediates its interaction with the polymer. We can replace or remove ligands on the surface of CdSe through chemical washing of nanocrystals or heat treatment of CdSe—P3HT blend films after they have been cast.

The effectiveness of charge transfer and transport is determined by the morphology of the blend. Aggregation of nanocrystals both in solution and in the polymer depends on the strength of the van der Waals interaction between the particles and thus on the separation between nanocrystals and their size. A balance between aggregation for transport of electrons and dispersion for more efficient charge transfer is required. The inventors have surprisingly discovered that fine control of morphology is obtained through the use of solvent mixtures. Solvent mixtures according to embodiments of this invention that contain pyridine, which is a ligand and solubilizes nanocrystals, can influence the dispersion of the nanocrystals in solution. Since spin casting is a non-equilibrium process, the dispersion of the nanocrystal in solution can be maintained in the polymer.

Figure 3:
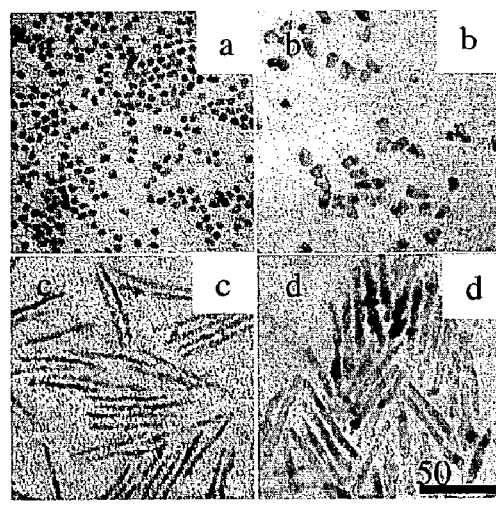
FIG. 3 shows a low resolution TEM image of a) 7 nm by 7 nm, b) 8 nm by 13 nm, c) 3 nm by 60 nm, and d) 7 nm by 60 nm CdSe nanocrystals

According to one embodiment of the invention a solvent mixture is used to control the phase separation down to the nanometer scale. The inventors have surprisingly found that it is possible using a solvent mixture to control phase separation in a film with a high concentration of nanocrystals (up to 90-95 weight %) in polymer, in particular P3HT down to the nanometer scale. The aim is to enhance the solubility of the nanocrystals by simultaneously using a good solvent and ligand for nanocrystals, and in particular CdSe, and a good solvent for the polymer for solution processing. A preferred example is the weak-binding Lewis base, pyridine, with its relatively low boiling point of 116° C. which was chosen as a ligand for the nanocrystals with the aim of facile removal. Pyridine treated nanocrystals of various shapes and sizes (FIG. 3) were co-dissolved with P3HT in a mixture of 4% to 12% by volume (vol. %) pyridine in chloroform to create a uniform film consisting of dispersed particles in polymer when spin cast. The preferred amount of pyridine to cover the nanocrystal surface is determined by the number of non-passivated Cd surface sites on the nanoparticle. Pyridine is miscible in chloroform, so that there is a twofold solubility increase for the nanocrystals: (a) pyridine coated nanocrystals are more soluble in chloroform than their naked counterparts and (b) they are highly soluble in the excess pyridine that is not bound to nanocrystals. Too much pyridine, however, is to be avoided, as this mediates the precipitation of P3HT, which is very soluble in chloroform and insoluble in pyridine. Therefore, there are three solubility regimes:

I. The low pyridine concentration regime: Insufficient solubility of the nanocrystals results in large-scale phase separation in the blend films promoted by nanocrystal flocculation.
   II. The intermediate pyridine concentration regime: Provided that the polymer is still sufficiently soluble in a miscible blend of the two solvents, the solubility enhancement in the nanocrystal component of the blend solution will lead to intimate mixing of the two semiconductors and therefore prevent phase separation upon spin coating.
   III. The high pyridine concentration regime: As pyridine is a non-solvent for the polymer component, we expect large-scale phase separation promoted by the flocculation of polymer chains.

Figure 4:
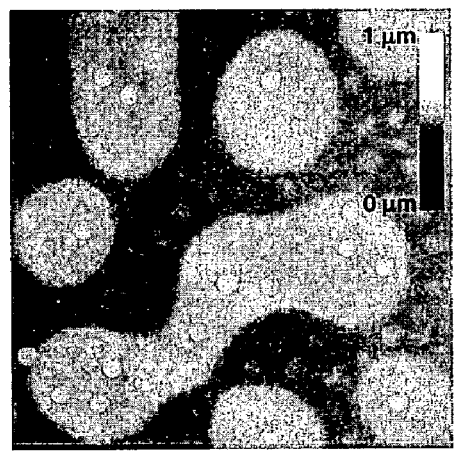
FIG. 4 shows a AFM-TM topography image of a film consisting of 90 wt. % 7 nm by 7 nm CdSe nanocrystals dispersed in P3HT, spin cast from chloroform. The scan area is 5 μm.

To investigate the morphology of nanocrystal-polymer films sensitive techniques such as atomic force microscopy (AFM), and bulk sensitive techniques such as transmission electron microscopy (TEM) are used. An example of regime I is shown in FIG. 4 for a blend of 90 wt. % 7 nm by 7 nm nanocrystals in P3HT that was spun from a single solvent of chloroform. FIG. 4 shows phase separation on a scale of several microns, which could also be detected under an optical microscope and even with the bare eye as the film scattered light. Light scattering is undesirable in thin film photovoltaic cells, as it can decrease the fraction of light absorbed.

Figure 5:
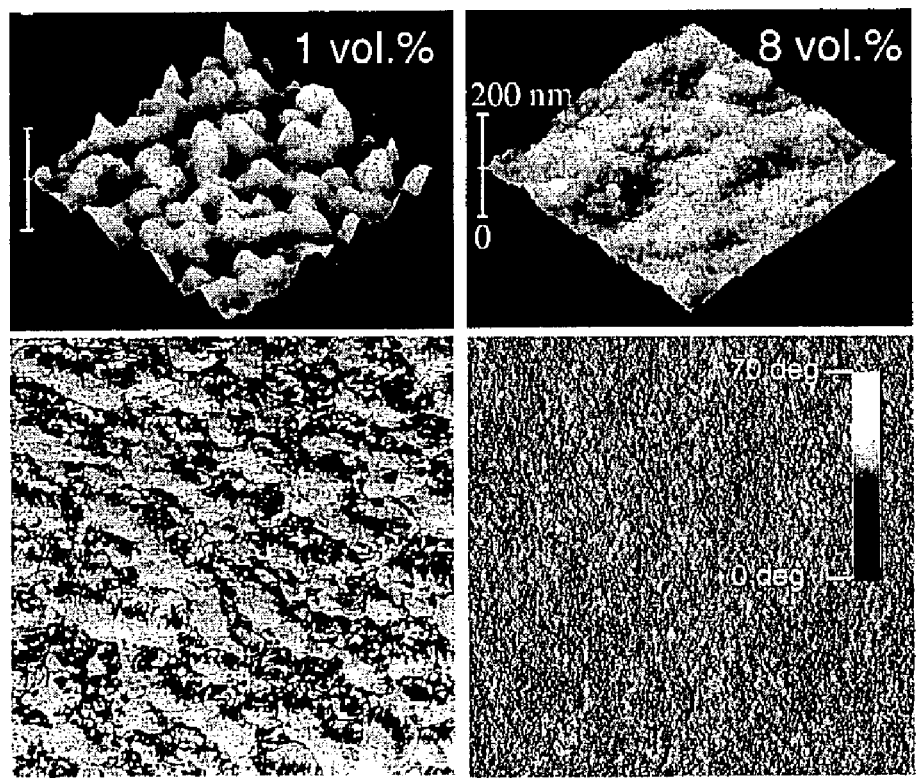
FIG. 5 shows a AFM-TM a) topography and b) phase images of films consisting of 90 wt. % 9 nm by 13 nm CdSe nanocrystals dispersed in P3HT spin cast from 1 vol. % and 8 vol. % pyridine in chloroform. Images are presented at the same scale for a scan area of 5 μm.

The study of the surfaces of nanocrystal-polymer blend films can be greatly enhanced by using AFM in the tapping mode (TM), as it is often possible to identify local differences in the composition of the film by comparing the phase and topography image. To illustrate the transition from regime I to regime II, FIG. 5 shows the AFM-TM topography and phase images for 5 μm scan areas of 9 nm by 13 nm nanorod-P3HT blend films spun from solvent mixtures with low and intermediate pyridine concentrations. Whereas the topography of these films is very rough for low pyridine concentration, an intermediate concentration yields much smoother films. The corresponding AFM-TM phase images demonstrate that the surface roughness relates to phase separation. Phase separation between the nanocrystals and polymer do not yield single material domains and as such, it is not possible to identify the individual polymer and nanocrystal areas. At low pyridine concentration, there is clear evidence for local variations in the composition of the film, whereas at intermediate pyridine concentration the phase image is very smooth. We can therefore attribute these two concentrations to regime I and II, respectively.

In yet another embodiment of this invention, it is contemplated that the high loading of semiconductor-nanocrystals in conjugated polymers in accordance with the instant invention results in a "smooth" thin film surface. This can be quantified. To express these results in a quantitative manner, the root mean square (RMS) of the film roughness is determined from AFM topography images as a function of pyridine concentration (FIG. 6). The RMS roughness decreases by an order of magnitude, as the pyridine concentration increases from 0 to 5 vol. %. Between 5 and 12 vol. % pyridine concentrations, there is only a slight increase in the RMS roughness, whereas there is an order of magnitude increase, as the pyridine concentration is taken from 12 to 20 vol. %. Using the above scheme we can attribute the concentration range from 0 to 5 vol. % to regime I, 5 to 12 vol. % to regime II and 12 to 20 vol. % to regime III. These concentration values are for a fixed overall concentration of nanocrystals and polymer in the binary solution. For the 90 wt. % of CdSe nanocrystals in P3HT used here, the partial concentrations were 45 g/l and 5 g/l respectively. It is to be understood that concentrations expressed with regard to washing may vary as much as 20% and still be effective.

Separation of charges only occurs for excitons that are created within the exciton diffusion range of a nanocrystals-polymer interface. As the single-material domain size decreases as a consequence of better nanocrystal dispersion, an increase in the external quantum efficiency (EQE) is predicted. The EQE can be used as a measure of the efficiency of charge separation given that following quantities are comparable for a set of devices: (i) incident light intensity, (ii) fraction of light absorbed, and (iii) charge collection efficiency at the electrodes, which is mainly given by the choice of electrodes. These three conditions are met for the devices for which EQE data are presented in FIG. 6. FIG. 6 shows the pyridine dependence of the EQE for blends of P3HT and 9 nm by 13 nm CdSe nanocrystal. The EQE increases by a factor of 1.4 in going from regime I to regime II and then decreases again for regime III. In a preferred embodiment, the maximum EQE of 35% is found for a pyridine concentration of 8 vol. % in the solvent mixture, ie binary solvent system.

A similar dependence of the EQE on pyridine concentration in the binary solvent system exists for spherical nanocrystal dispersed in P3HT. The maximum EQE is also at 8 vol. % pyridine concentration, which is comparable to the value found for the low aspect ratio nanorods described above. For a fixed nanocrystal concentration, the optimal concentration of pyridine is determined by the surface-to-volume ratio of the nanocrystal. For devices comprised of 3 nm by 100 nm nanorods, the best devices are cast from solutions containing 12 vol. % pyridine, whereas, devices with 7 nm by 60 nm nanorods require only 4 vol. % pyridine. The 3 nm diameter nanorods have a factor of two higher surface-to-volume ratio than the 7 nm nanorods. More pyridine is required to maintain the surface of the thinner nanorods covered with pyridine, as these bound pyridine molecules are in dynamic equilibrium with free pyridine in solution.

In another embodiment of the instant invention it is possible to vary the binary solvent mixture employed in accordance with this invention by substituting pyridine with another ligand. For example, CdSe, CdTe and InP nanocrystals are synthesized in a mixture of consisting of mostly TOPO or TOP and various phosphonic acids. After the nanocrystals are recovered and stored, there is a large excess of TOPO, (or TOP) in the product and the nanocrystals are passivated by this organic surfactant. Nanocrystals with a shell of TOPO are less prone to oxidation and dissolve readily in a large variety of solvents including toluene, chloroform, hexanes, THF, pyridine and butanol. TOPO can be replaced by other ligands for cadmium such as thiols, amines and other phosphine oxides and phosphonic acids, see below.

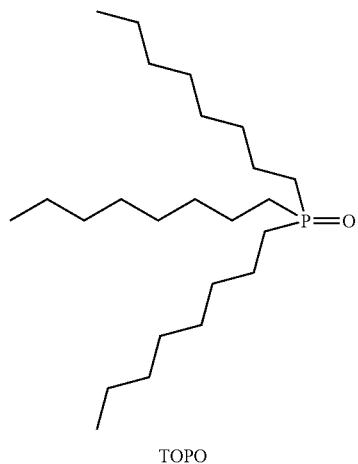

TOPO

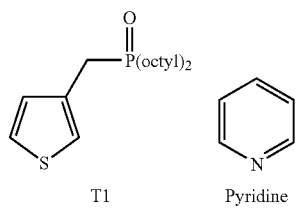

T1     Pyridine

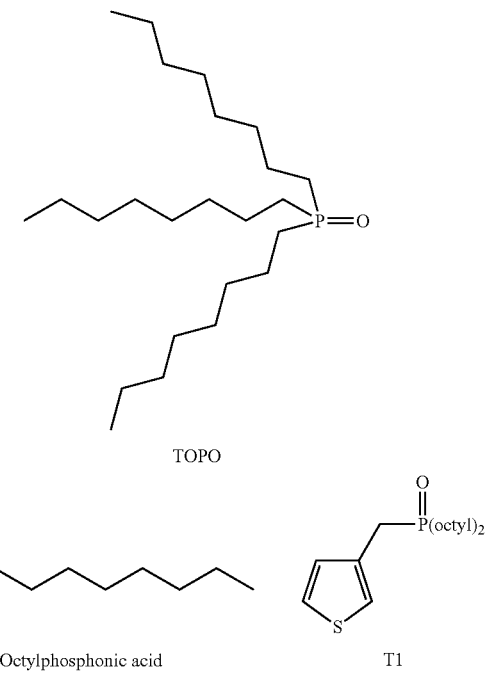

TOPO

Octylphosphonic acid     T1

Non-conjugated ligands do not absorb in the visible portion of the electromagnetic spectrum and do not add to the photogenerated current of a solar cell. Oligothiophenes with phosphine oxide or phosphonic acid functionalities attached can bind to the surface of CdSe and other semiconductor-nanocrystals. These conjugated ligands with longer conjugation, above 4 monomer units, absorb in the visible, region of the electromagnetic spectrum and can contribute to the photocurrent, and thus their use is contemplated by one embodiment of this invention. Phenylphosphonic acid is a non-limiting example of ligands of preferred use. The energy levels of oligothiophenes with greater than 10 monomer units approach that of the parent polymer, P3HT. TnPA is known as thiophene (n number of thiophene rings)phosphonic acid, shown below. There are three types of preferred thiophene derivative ligands contemplated for the instant invention. The number of thiophene rings can vary and they employ either phosphonic acid, phosphine oxide or an oligothiophene amine.

including TOPO, pyridine and a modified TOPO in which one octyl moiety is replaced by a thiophene ring (T1), are compared in FIG. 22.

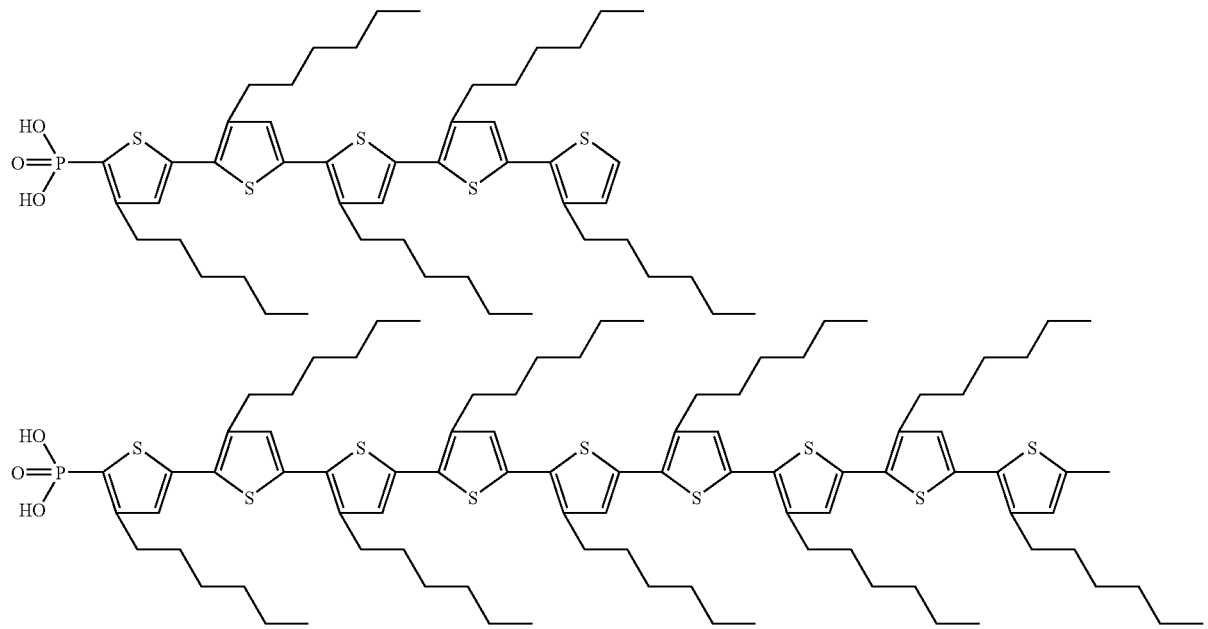

Because large oligomers bind closely to the nanocrystals and can interact intimately with the polymer, they can assist in improving the charge transfer rate between the two semiconductors. Oligomers that also have similar side chains to the polymer can help large nanocrystals repel each other and disperse well in the polymer. In a preferred case, nanocrystals are blended with a polymer that contains chemical functionalities such as phosphine and phosphine oxides to bind to the nanocrystal. In this instance, the polymer can be brought in close proximity to the nanocrystal to promote fast and efficient charge transfer.

To replace TOPO, or other synthetic solvent, the nanocrystals are washed with a suitable solvent for the particular surfactant in on the nanocrystal. Then the nanocrystals Ire dissolved in a solvent with an excess of the desired ligand to be used, and refluxed at high temperature for several hours. High temperature ensures movement of ligands on and off the nanocrystal surface and the excess maintains the equilibrium of the new ligand on the nanocrystal surface. Another effective chemical treatment that reduces the exposure of nanocrystals to oxygen and water at high temperature is to dissolve the nanocrystals in an excess of the replacement ligand, then precipitate the particles in a solvent for TOPO, or other synthetic solvent and discard the supernatant after centrifugation. Pyridine, with a boiling point of 116° C., is one of the most facile ligands to displace, and is preferred for use with CdSe. Nanocrystals passivated by pyridine are less soluble than those covered by TOPO, but they can easily be stripped of pyridine by drying or heating the nanocrystals.

Figures 22A, 22B, 22C:
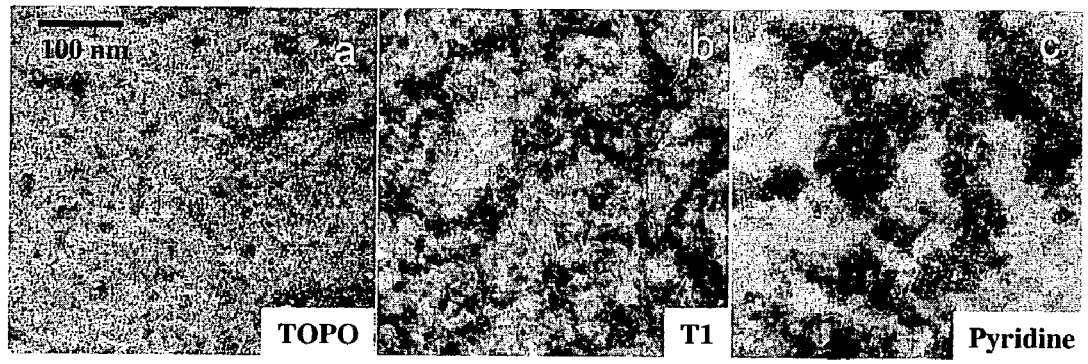
FIG. 22a shows a TEM of 40 wt % 5 nm CdSe nanocrystals in P3HT for TOPO treated nanocrystals.
FIG. 22b shows a TEM of 40 wt % 5 nm CdSe nanocrystals in P3HT for T1 treated nanocrystals.

In photovoltaic devices fabricated with nanocrystal-polymer blends, the ligands on the nanocrystals determine the morphology of the film and the extent of microphase separation. The morphology of blends of CdSe with various ligands, As a non-limiting example, CdSe nanocrystals passivated by TOPO, with non-polar alkyl chains, can be dispersed uniformly in the non-polar matrix of P3HT. The distinct spacing between the particles corresponds to 11 Å, the approximate length of the TOPO molecule (FIG. 22a). When TOPO is modified with the replacement of one octyl chain with a thiophene ring to give T1, these nanocrystals, when dispersed in P3HT, behave differently from TOPO coated particles (FIG. 22b). Nanocrystals coated with T1 aggregate more than TOPO coated particles and the aggregates of CdSe nanocrystals assemble into lines of nanoparticles. While not wishing to be bound by any particular theory or principle, it is possible that the thiophene rings on the T1 molecules pi-stack with the thiophene rings on the polymer, causing the nanocrystals align along a polymer chain. The presence of surfactants on the nanocrystal surface can be discerned from the separation between particles within the aggregates and amongst the chains of nanocrystals. In contrast, nanocrystals coated by pyridine aggregate in P3HT (FIG. 22c). While not wishing to be bound by any particular theory or principle, it is possible that because pyridine is a weak Lewis base, some of the pyridine is removed from the nanocrystal surface during the evaporation of the solvent as the films are cast. As a consequence, the van der Waals interaction between the largely polar nanocrystals in the non-polar P3HT results in microscale phase separation between the organic and inorganic components of the composite. Pyridine washed nanocrystals are in more intimate contact with neighbouring particles such that there is no distinct separation between nanocrystals in the film as was observed with TOPO coated particles. Similar differences in aggregation behaviour between TOPO and pyridine coated nanocrystals were observed for the polymer MEH-PPV, which is a more polar than P3HT.

It is understood that the instant invention contemplates as a preferred embodiment not actually replacing 95% of the surfactant on the rods that is there from synthesis processing. Intuitively, one would think that washing 3 times would eliminate more residual surfactant, and this would be preferred, as the surfactant interferes with charge transfer. However, the inventors have surprisingly found that with only one washing step, some surfactant is left on which results in a photovoltaic device having a much greater and unexpected results than one would have predicted. The EQE for such a device is improved 3 to 5 fold over those devices washed three times.

Nanocrystals 5 nm in diameter are washed 3 times in methanol to remove excess TOPO and then dissolved in a minimum of pyridine (50 µl per 100 mg CdSe) and precipitated in hexanes three times to obtain particles with pyridine on the surface. Methanol washed nanocrystals were refluxed first with pyridine to displace TOPO, precipitated with hexanes and then refluxed in a solution of T1 dissolved in toluene for 12 hours to yield T1 coated particles. Films were obtained by spin casting from solutions consisting of 40 wt. % nanocrystals in P3HT dissolved in chloroform on to NaCl IR windows. These samples were dipped in water to float off the blend films and copper TEM grids with holey carbon were used to pick up the films.

In another embodiment of the instant invention the inventors have surprisingly discovered that heat treatment is an effective method to enhance the mobility of organic molecules bound to an inorganic surface and that treatment of the nanocomposite near the glass transition temperature of the polymer enables the movement of these molecules within the film towards the surface. In organic blends, thermal annealing has been used to promote the equilibrium morphology of a spin cast film and in some cases to enhance phase separation and crystallization within the composite. For nanocrystal-polymer blends, heat treatment allows for modification of the nanocrystal-nanocrystal and nanocrystal-polymer interface to unexpectedly enhance charge transfer and transport in improving the performance of a photovoltaic device. The excess pyridine in the binary solvent, used to control the dispersion of nanocrystals in polymers, will be shown to act as non-radiative recombination centers for excitons created in P3HT. As a consequence, these excitons do not contribute to the photocurrent. Thermal annealing of films in accordance with the embodiments of this invention results in removal of interfacial pyridine and excess, unbound pyridine within the polymer regions. Significant enhancements in EQE are observed in devices after heating, which can be related to the recovery of these lost excitons for charge transfer and photocurrent generation.

The normalized photocurrent measured for a 90 wt. % 3 nm by 60 nm CdSe nanorods in P3HT spin cast from a solvent of 10 vol. % pyridine in chloroform is given in FIG. 7a (open circles, prior to annealing; closed squares, after annealing). The absolute maximum EQE is 15% under 0.1 mW/cm$^2$ illumination at 455 nm under flowing argon. Upon heating at 120° C. under reduced pressure of approximately 50 mTorr for 3 hours and cooling for 8 hours to room temperature, the photocurrent of the same device is enhanced significantly (FIG. 7a), higher than one would ordinarily expect.

While not wishing to be bound by any particular theory or principle, the unexpected results may be able to be explained as follows. A ratio of the photocurrent for the heated device to that of the device prior to heating shows an overall enhancement by a factor of 2.5 and a particularly strong increase by a factor of greater than 6 near 650 nm with a shoulder at 700 nm (FIG. 7b). To understand the origin of this red EQE enhancement peak, a device with only 3 nm by 60 nm CdSe nanorods was fabricated and heated under the same conditions. An analysis of the photocurrent prior and subsequent to heat treatment shows that there is only an enhancement feature centered around 700 nm. We can therefore attribute this red shift in the blend photocurrent to the nanorods. Consequently, without being bound to a particular theory or mechanism of operation, it is postulated that heat treatment is seen to aid both in the removal of interfacial pyridine and in bringing nanorods closer together resulting in unexpected and surprisingly superior efficiencies. This aggregation of neighboring nanorods is likely to improve electron transport between nanorods, for which the separation distance between hopping steps is decreased. Furthermore, the removal of interfacial pyridine can also have the effect of enhancing charge transfer between CdSe and P3HT by bringing these two materials into closer electronic contact. These two effects most likely resulted in the overall photocurrent enhancement by a factor of about 2.5 across all absorbed wavelengths.

Figure 8:
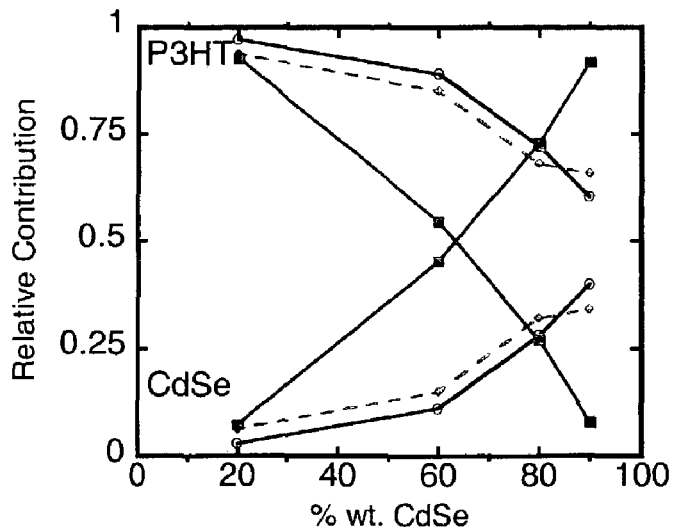
FIG. 8 shows the relative contribution of P3HT to the absorption (solid diamond, dashed line), photocurrent (open circle, solid line) and photocurrent after 120° C. heat treatment (solid square, dashed line) of series of 3 nm by 60 nm nanorod devices in P3HT at various nanorod concentrations.

The greatest photocurrent increase occurs in the region between 500 nm and 700 nm, where a factor of greater than 6 is obtained for the 90 wt. % CdSe blend device and both CdSe and P3HT contribute significantly to the absorption of light. To determine the relative contributions, we can compare the fraction of light absorbed with the fraction of the photocurrent produced by each material component. The absorption spectrum of a series of devices with varying CdSe concentration can be fitted into a linear combination of the individual CdSe and P3HT spectra (FIG. 8).

Figure 9:
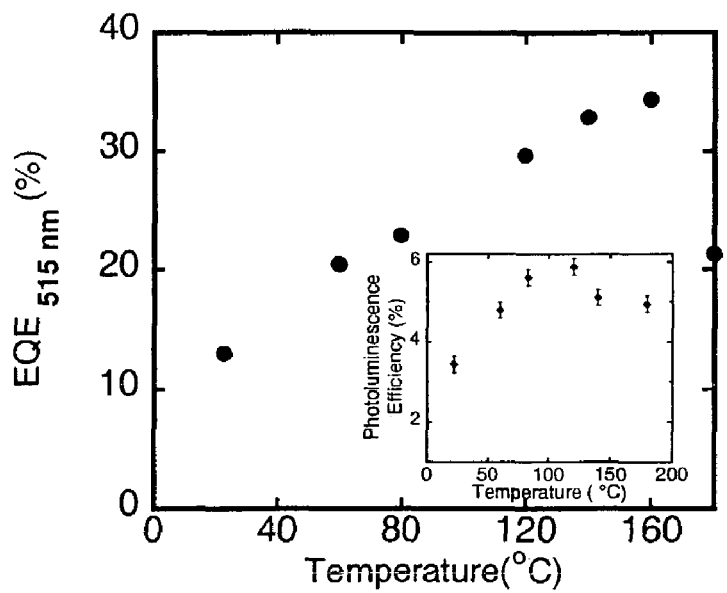
FIG. 9 shows the EQE of 90 wt. % 7 nm by 14 nm CdSe in P3HT under ~0.1 mW/cm$^2$ illumination at 515 nm. The inset shows the PL efficiency of 60 wt. % 7 nm by 14 nm CdSe in P3HT samples under 514 nm excitation after heat treatment at various temperatures.

There is no significant change in the absorption between 400 nm and 700 nm of the blend device after heating. For concentrations greater than 40 wt. %, the contribution of P3HT to the photocurrent is significantly less than the proportion of light that is absorbed by the polymer. In the 90 wt. % CdSe device, P3HT is responsible for 61% of the light absorbed but the polymer only contributes to 8% of the photocurrent. This indicates that a substantial amount of light absorbed by the P3HT does not contribute to the generation of current and is lost either to non-radiative or radiative recombination pathways. However, upon heat treatment of these devices at 120° C., the change in the photocurrent spectra yields P3HT contributions that are closer to the proportion of light that it absorbs. For the 90 wt. % CdSe device, the P3HT portion of the photocurrent increases dramatically to 66%, comparable to the 61% of the absorbed light in P3HT. This amplification of the external quantum efficiency is observed from 60° C. to 160° C., decreasing once again at 180° C. as aluminum migrates through the film and the device degrades, FIG. 9. Correspondingly, the PL efficiency of a 60 wt. % CdSe blend film as a function of treatment temperature, rises up to 120° C., decreases thereafter and remains constant at higher temperature (FIG. 9 inset). This invention contemplates that the thermal annealing temperature may be as great as 200° C.

These unexpected results may be explained as follows. Since the PL efficiency of CdSe in the blend is less than 0.1%, the PL of the sample arises predominantly from P3HT. Heating of P3HT is known to result in enhanced crystallinity, which quenches the PL efficiency. This effect is observed in heated films of P3HT at as low a temperature as 40° C. Increased crystallinity, therefore, explains the slight decrease in PL efficiency observed in the blend films above 120° C., but fails to account for the substantial increase in PL efficiency below 120° C. At low temperatures, the removal of excess pyridine within the polymer is the likely cause for the increase in P3HT PL efficiency with increasing treatment temperature. It is possible, that this is because some of the photons absorbed in P3HT undergo non-radiative recombination at pyridine sites within the polymer in the untreated film and do not contribute to PL. After heat treatment, these photons can contribute to both radiative decay and charge transfer. Consequently, the removal of excess pyridine results in a larger P3HT contribution to the photocurrent leading to the enhancement in EQE observed in the region between 500 nm and 700 nm.

Thermal treatment according to preferred embodiments of this invention is especially important to enhance EQEs in high aspect ratio nanorod devices, which have a high surface-to-volume ratio and require higher concentrations of pyridine (>8 vol. %) in the spin casting solution. In devices consisting of these nanorods, there are large nanorod-nanorod, and nanorod-polymer interfacial areas containing pyridine as well as substantial amounts of excess pyridine. Removal of this pyridine resulted in the large EQE improvements of up to a factor of six observed in FIG. 7. In contrast, nanorods of dimension 7 nm by 60 nm are blended with P3HT in solvents with only 4 vol. % pyridine and the maximum EQE increase after heating is by only a factor of 1.3 (FIG. 10).

The instant invention contemplates the use of nanorods with low surface-to-volume ratios, and thus pyridine removal from thin films (<200 nm) results from merely pumping on the sample at low pressure (<$10^{-6}$ mbar) and no improvement in performance is observed upon heat treatment. Moreover, heat treatment of thin films is detrimental to the open-circuit and fill factor as aluminum diffuses through a significant portion device.

In a series of 90 wt. % 7 nm by 60 nm nanorods CdSe in P3HT devices ranging from 100 nm to 350 nm in thickness, those above 200 nm thickness improve upon heat treatment at 120° C. (FIG. 11).

As the device increases in thickness the relative enhancement of the EQE also rises (FIG. 12a). The absolute improvement in EQE after treatment also increases with thickness (FIG. 12b) but is limited at 346 nm thickness due to the poorer transport properties of the thickest device. As hybrid nanorod-polymer solar cells become more efficient through nanorod alignment and the synthesis of rods greater than 100 nm in length, thicker films with higher optical density to absorb more sunlight can be used. In these thick films, heat treatment is preferred to realize high performance devices.

In yet another embodiment of the instant invention the inventors have surprisingly realized unexpected strategies for increasing the carrier mobility and improving charge collection resulting in enhanced cell performance. For blends of an electron transport material with a hole transport material, the creation of percolation pathways is necessary to convey charges. In dispersion of nanocrystals with polymers, terminations in the pathways for electrons act as traps or recombination centres. Increasing the size of the nanocrystals reduces the number of these terminations and thus enhances the performance. However, to achieve the efficiencies observed in commercial solar cells, it is desirable to have higher carrier mobilities and lower recombination rates. With nanorods that have a length similar to the thickness of the device it is possible to have a directed pathway in which the carrier mobility is similar to that of a 1-dimensional wire. Thus the problems of percolation and hopping transport are eliminated. By controlling the aspect ratio of CdSe nanorods dispersed in P3HT, the inventors have surprisingly discovered that length scale and direction of electron transport can be tailored through a thin film PV device.

As nanocrystals increase in aspect ratio from spherical to rod-like, they move from the molecular regime closer to the realm of a one-dimensional wire and they become less readily soluble. In FIG. 13a, nanorods aggregate in P3HT to form a single island spanning several microns when films are cast from chloroform. However, for the same concentration, the nanorods disperse uniformly within the polymer film when cast from a pyridine/chloroform solvent mixture, FIG. 13b. This dispersion of nanorods in pyridine and chloroform is essential for the casting of uniform films as well as for creating a large charge transfer interface with P3HT for reduced exciton recombination.

Because the architecture of these solar cells is such that the electric field extends across the thickness of the device rather than in the plane, it is also important to characterize the morphology of the blend film in cross section. To accomplish this, a solution of 60 wt. % 10 nm by 10 nm CdSe nanocrystals in P3HT was spin cast from solution onto a Polybed epoxy disk. The disk was then microtomed with a diamond knife to yield 60 nm thick films. These ultrathin films on one edge contain a cross section of the nanocrystal-P3HT blend. In the TEM image of the film FIG. 14 the dark section without nanocrystals is the epoxy substrate, on which the P3HT film, approximately 100 nm across, containing nanocrystals can be seen. The nanocrystals span the entire film thickness uniformly with no significant phase separation in the lateral direction.

Figures 15A, 15B:
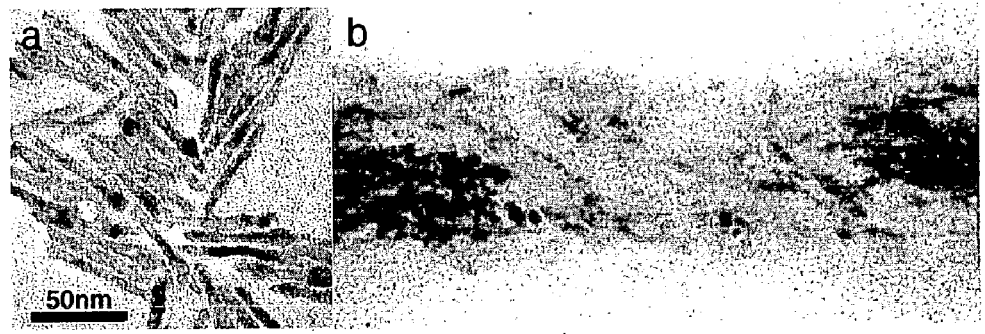
FIG. 15a shows a 7 nm by 60 nm CdSe nanorods.
FIG. 15b shows a TEM of a cross section of a 100 nm film consisting of 40 wt. % CdSe nanorods in P3HT.

Obtaining a cross section for long nanorod-polymer films was very difficult. The nanorods, because of their large size, resisted being cut and the blend films had a tendency to tear and be dragged by the knife. Consequently, the films, once they were spun onto an epoxy disk, were imbedded in epoxy resin over the span of two days and cured to provide further support during the microtoming. The resulting cross section for 40 wt. % 7 nm by 60 nm CdSe nanorods in P3HT shows nanorods spanning a substantial portion of the thickness of the film FIG. 15b.

As the nanorods increase in length to span the thickness of a photovoltaic device, it is predicted that the electron transport will improve substantially. However, the predicted improvement in transport assumes that the nanorods are aligned perpendicular to the plane of the substrate and that they are long enough for the electrons to be transported entirely within one nanorod. FIG. 15 reveals that the nanorods are randomly dispersed, but nevertheless, there are some particles oriented with a significant component along the direction of electron transport. Further evidence for the partial alignment of nanorods and the beneficial effects on electron transport can be observed in the photocurrent.

Figure 16:
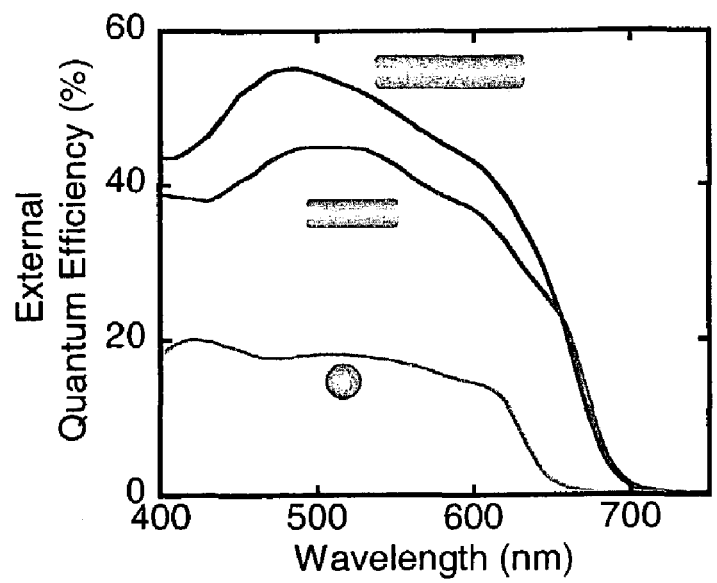
FIG. 16 shows as the length of a 7 nm diameter nanorod is increased successively from 7 nm to 30 nm and to 60 nm, the EQE for the 90 wt. % CdSe in P3HT devices, rises by almost a factor of 3 to 54%, under illumination of 0.084 mW/cm$^2$ at 515 nm.
Figures 17A, 17B, 17C:
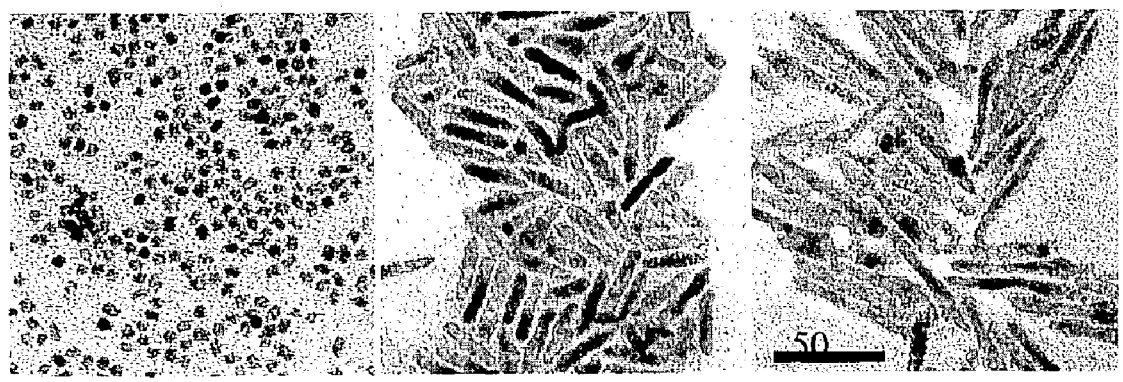
FIGS. 17a-c shows a TEM of 7 nm diameter nanocrystals with lengths, a) 7 nm, b) 30 nm and c) 60 nm. The scale bar is 50 nm and all TEMs are at the same scale.

The EQE can be used as a measure of the efficiency of charge transport given that the following quantities are comparable for a set of devices: (i) incident light intensity, (ii) fraction of light absorbed, (iii) charge collection efficiency at the electrodes, which is mainly given by the choice of electrodes, and (iv) the charge transfer efficiency, as determined from photoluminescence quenching. These four conditions are met for the devices for which EQE data are presented in FIG. 16. We can therefore conclude that as the aspect ratio of the nanorods increases from 1 to 10, FIG. 17, the charge transport has to improve significantly to yield an EQE enhancement by a factor of approximately 3. In networks consisting of shorter nanoparticles, electron transport is dominated by hopping between discrete particles that comprise the pathway to the electron-collecting electrode. However in devices consisting of longer particles, band conduction is prevalent as pathways can be formed from a single nanorod. Because the thickness of the nanorod-polymer film in a device is approximately 200 nm, a 60 nm long nanorod can penetrate through a significant portion of the device while a 30 nm and a 7 nm long particle are progressively less effective, FIG. 16. The best device, which contained 7 nm by 60 nm nanorods, performed with a maximum EQE of 55% under 0.1 mW/cm² illumination at 485 nm, and this value has been remarkably reproducible. The results reported represent the median of five sets of devices made on separate occasions from three different synthetic batches of CdSe totaling 57 individual solar cells. The maximum external quantum efficiency of each of these 57 devices are all within 10% relative to the median with the highest obtained efficiency at 59%, all under ~0.1 mW/cm$^2$ monochromatic illumination. Individual devices have been characterized repeatedly over the time scale of several months and showed no significant change between measurements.

On account of the superior carrier transport properties of inorganic semiconductor nanorods as compared with semiconducting organic polymers and small molecules, these hybrid nanorod-polymer solar cells perform with the highest EQE, under low intensity illumination, reported for a polymer containing cell to date.

It is contemplated that the photovoltaic devices according to the instant invention incorporate highly branched nanorods. Highly branched nanorods were synthesized according to those techniques known in the prior art from 10 injections of precursors. Upon subsequent injections during the synthesis, these nanorods developed many nucleation sites for branching in addition to increasing in length. Because many of these branched nanorods have lengths above 100 nm, further increases in EQE were expected when used in nanorod-polymer PV devices. Branching is caused by a low energy zinc blende defects in the wurtzite structure of the rods similar to stacking fault defects that cause the nanorods to have kinks along its length. As a consequence, it is expected that the mobility of the carriers within the branched nanorods is similar to the unbranched rods. Furthermore, the interaction between a branch and the main body of the nanorod is stronger than between two discrete nanorods in physical contact. Thus, band transport is prevalent within a branched nanorod and hopping of electrons occurs between discrete nanorods.

It is understood that embodiments of the invention include even more complex shaped nanocrystal particles. In embodiments of the invention, the initial nucleation event yields a core with a cubic crystal structure (e.g., a zinc blende crystal structure). Later, arms with a hexagonal crystal structure (e.g., wurtzite) can grow out from the core. However, different growth conditions can be provided to statistically alternate the formation of cubic and hexagonal crystal structures, thus leading to irregular branching. Precise control of temperatures throughout the reaction may yield sequentially branched "inorganic dendrimers", see Mana et al., *J. Am. Chem. Soc.*, 2000, 122, 12700-2706 and U.S. Ser. No. 10/301,510, filed Nov. 20, 2002, currently pending.

The inherent property of a tetrapod to self-align on a substrate with one arm always pointing towards one electrode, combined with the low band gap material such as CdTe, makes the tetrapod semiconductor-nanocrystal embedded in a conjugated polymer an especially preferred embodiment. In comparison to nanocrystal particles that are randomly oriented, the tetrapods according to embodiments of the invention are aligned and can provide for a more unidirectional current path than randomly oriented nanocrystal particles.

Figure 18:
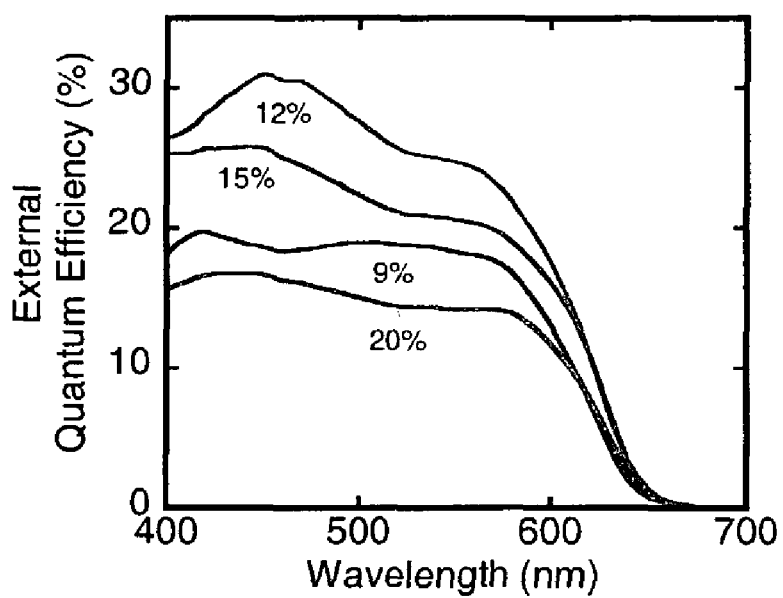
FIG. 18 shows a the EQE for the 90 wt. % 3 nm by 100 nm branched CdSe nanorods in P3HT devices as a function of pyridine concentration.

The photocurrent spectra for a blend of 90 wt. % CdSe branched nanorods in P3HT for various pyridine concentrations are displayed in FIG. 18. The preferred pyridine concentration for branched nanorods occurs at 12%, which is significantly higher than for shorter unbranched rods, which is 8% or less. The maximum EQE for these devices is 31% under approximately 0.1 mW/cm$^2$ illumination at 450 nm. Contrary to the predicted results, this EQE is almost a factor of two lower than the devices from 60 nm nanorods.

The dispersion of longer nanorods (>100 nm) in P3HT is limited by their solubility in pyridine-chloroform. The branched nanorods, when dissolved in pyridine-chloroform, formed a gelatinous, viscous solution. This is an indication of the lower solubility of the branched objects and the higher nanorod-nanorod interaction relative to the nanorod-solvent interaction. With these branched objects, the CdSe—P3HT films cast were non-uniform and scattered light, a clear indication of macrophase separation. Any enhancement in transport efficiency is compromised by the decrease in charge separation efficiency resulting from a decrease in interfacial area between nanorods and P3HT.

Long cadmium selenide nanorods, in solution at high concentrations and passivated by pyridine, are separated by small distances, in some cases the diameter of pyridine. Under such proximity, the van der Waals attraction, which scales as the volume and distance is very strong and promotes agglomeration. To solubilize long nanorods at the high concentrations required for making sufficiently thick films for PV devices is a challenge. Ligands with greater size and longer chains are required to extend the length of nanorods added to polymers. To prevent these ligands from acting as a barrier layer they must be electrically active and the energy levels must be such that charge transfer between CdSe and P3HT is facile.

Figure 19A:
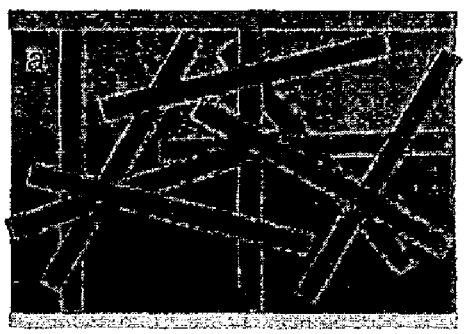
FIG. 19a shows tetrapod nanocrystals unaligned.
Figure 19B:
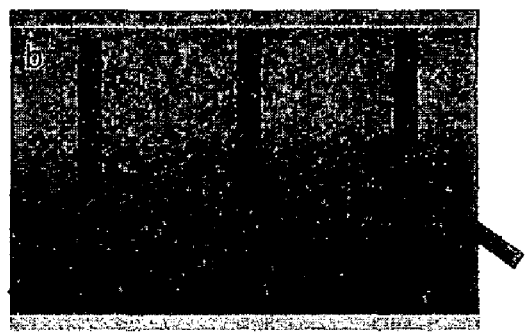
FIG. 19b shows tetrapod nanocrystals alligned.

Full band conduction of electrons requires that the transport be contained entirely within a single nanocrystal. Further improvements in transport rely on the alignment of nanorods across the film thickness. Methods for nanorod alignment include electric field and stretch alignment, both of which require significant modifications of the current device processing and architecture. Tetrapods, with four identical nanorod arms attached at a cubic center, orient themselves naturally on a surface with one arm perpendicular to the substrate plane as seen in FIG. 19. The next generation of hybrid solar cells could therefore incorporate tetrapods as self-aligning nanocrystals to transport electrons efficiently.

Another embodiment of the instant invention is the surprising film thickness that the nanorod/polymer photovoltaic devices of the instant invention operate at. One of the many advantages of using nanocrystals and polymers are the high absorption coefficients compared to bulk inorganic semiconductors. These form thin films, typically less than 300 nm, which are able to absorb more than 90% of the incident radiation. Unlike conventional inorganic semiconductor solar cells, which require more than several micron thicknesses to absorb light, low material usage and flexible devices are possible with nanocrystals and polymers. While not wishing to be bound by any particular theory or mechanism it is possible that because the good transport properties of nanorods can be utilized when the length of the nanorods spans a significant portion of the film, the dependence of the efficiency of nanorod-polymer PV devices with film thickness provides further information about the nature of carrier transport.

Figure 20:
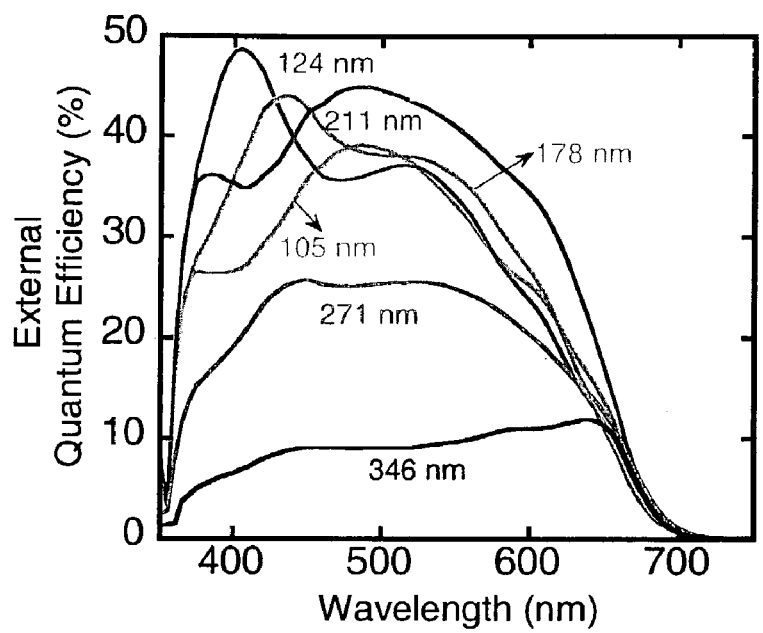
FIG. 20 shows the EQE spectra for a series of 90 wt. % 7 nm by 60 nm CdSe in P3HT devices with different film thicknesses.

The photocurrent spectra of the devices for which the absorption is discussed above are shown in FIG. 20. As the film thickness increases from 100 nm to 350 nm, the corresponding increase and subsequent decrease in EQE does not arise solely from increase in absorbed light. The shape of the spectra depends on the thickness of the device and the photoresponse in the red regions of the spectra increases with thicker films. This can be attributed to a weak filter effect that results from part of the film not contributing to the photocurrent. Because in thick films networks of physically touching nanorods transport electrons with low carrier mobility, compared to transport contained entirely in one particle, and electrons generated near the PEDOT:PSS electrode must traverse many nanorods to reach the collecting aluminum electrode. Blue light, which is absorbed closer to the transparent electrode, does not strongly contribute to the photocurrent. In addition, the electric field across the device responsible for charge separation is decreased at a given voltage bias for a thicker film as compared with the thinner one.

The instant inventors have surprisingly discovered that nanorod-polymer devices can be made significantly thicker at 200 nm to achieve more absorption of light because the dispersion characteristics of the nanorods are well controlled and the transport properties in the nanorods are more efficient than the mentioned organic materials.

Figures 21A, 21B:
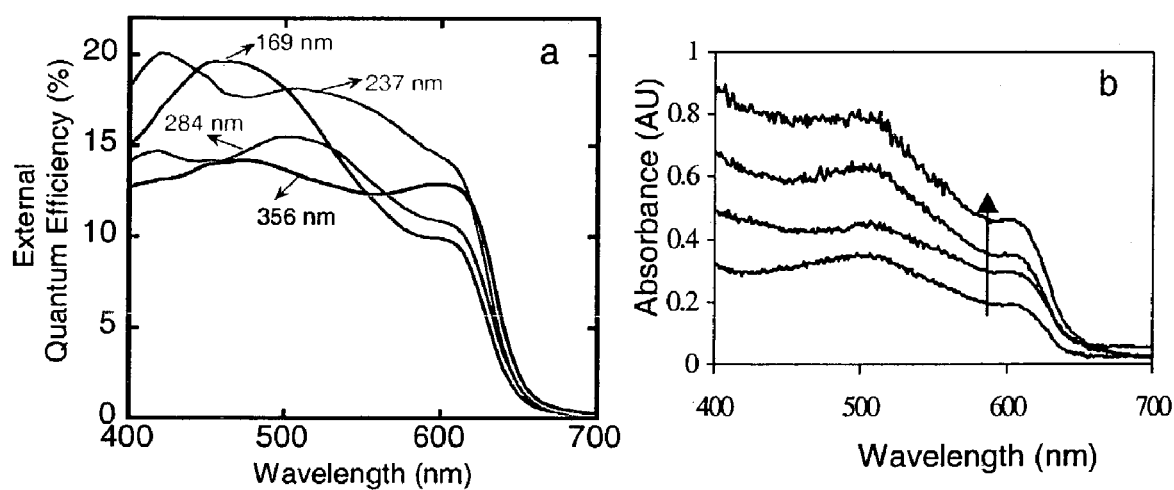
FIG. 21a shows the EQE spectra for 90 wt. % 7 nm by 7 nm CdSe in P3HT at various film thicknesses.
FIG. 21b shows the corresponding absorption spectra for these devices, shown as a function of increasing thickness.

The photocurrent spectra of 90 wt. % 7 nm spherical nanocrystals in P3HT devices display similar properties, FIG. 21a. The absorption spectra of the set of devices with varying thicknesses are shown in FIG. 21b. As the thickness of the device increases, the EQE as a function of wavelength shows a more pronounced response in the red regions of the spectrum. For these spherical nanocrystals, the optimum device thickness is at 160 nm, which can be compared with the optimum of 212 for long nanorod devices. Because long nanorods show improved electron transport relative to shorter dimension spheres, devices can be made thicker to absorb more light, before hopping transport begins to dominate. This further provides evidence for the benefits of using one-dimensional nanorods to improve transport.

Figures 23A, 23B:
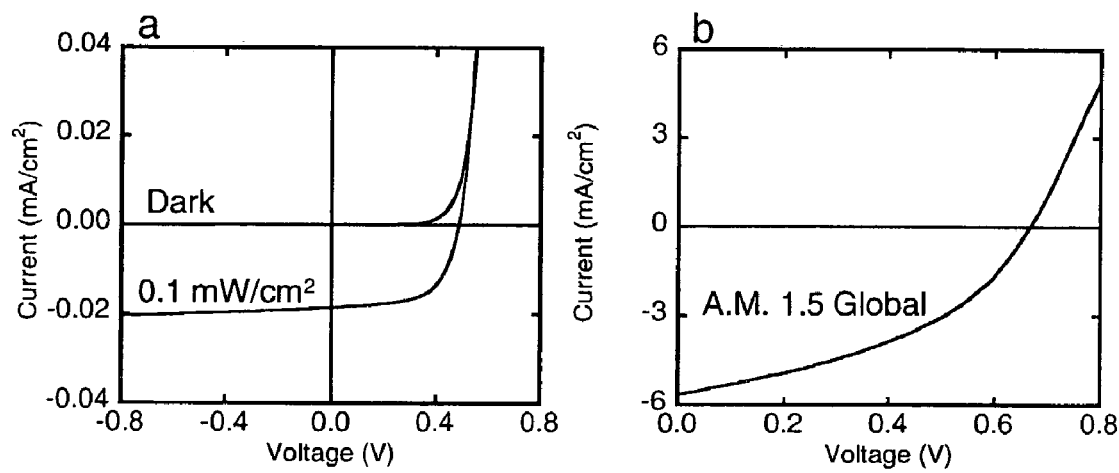
FIG. 23a shows the I-V characteristics for 90 wt. % 7 nm by 60 nm CdSe nanorods in P3HT under 0.1 mW/cm$^2$ illumination at 515 nm.
FIG. 23b shows the solar cell characteristics of the same FIG. 23a device, measured with a simulated AM 1.5 Global light source, include a short-circuit current of 5.7 mA/cm$^2$, a FF of 0.42, and an open-circuit voltage of 0.67V to yield a solar power conversion efficiency of 1.7%.

In another embodiment of the invention there is disclosed herein a photovoltaic device incorporating a PEDOT:PSS (poly(ethylene-dioxy)thiophene:poly(styrene sulphonic acid)) hole transporting layer on top of an ITO electrode The incorporation of a hole conducting layer on top of the ITO electrode (PEDOT/PSS) gives a number of beneficial effects including, e.g., providing a much smoother surface upon which to deposit, e.g., by spin casting, the nanocomposite layer, and, its work function matches the valence band of the conducting polymer (P3HT) much better than does ITO, thereby facilitating hole conduction. Of course, one may select a variety of different hole conducting layers depending upon the work function of the electrode material that is employed. A non-limiting example of this device is shown in FIG. 4. The most preferred embodiment of the instant invention is a semiconductor nanocrystal-polymer solar cell constructed by spin-casting a solution of 90 wt. % 7 nm by 60 nm CdSe nanorods in P3HT onto an ITO glass substrate coated with PEDOT:PSS with aluminum as the top contact. A power conversion efficiency of 6.9% was obtained under 0.1 mW/cm² illumination at 515 nm inside an inert atmosphere of flowing argon. At this intensity, the open circuit voltage is 0.5V, the photovoltage at the maximum power point is 0.4V and the fill factor is 0.6, FIG. 23a. For plastic PV devices, this monochromatic power conversion efficiency is one of the highest reported. Very few polymer-based solar cells are able to attain monochromatic power conversion efficiencies above 2%. The most reliable example is that of a blend from a soluble derivative of $C_{60}$ and MEH-PPV, which reaches an efficiency of 5%.

In another embodiment of the invention, alignment of the semiconductor-nanocrystals across the film thickness can be further controlled with external aids. Alignment aids can include aids that are known to those of ordinary skill in the art. These include aids that can produce an electrical, magnetic fields or stretch alignment, that can be used to align the nanocrystals. For the purposes of this invention alignment may be defined if between 10 and 99% of the nanocrystals have their longitudinal axis aligned not more than 20 degrees from the normal to the thin film plane.

EXPERIMENTAL

The above description has numberous embodiments of the instant invention detailed therein. Some parameters of the above embodiments are summarized in Table 1. Further non-limiting examples of the instant invention are detailed below. Pyr/Chlor. is a pyridine in chloroform mixture

TABLE 1

Figure 14:
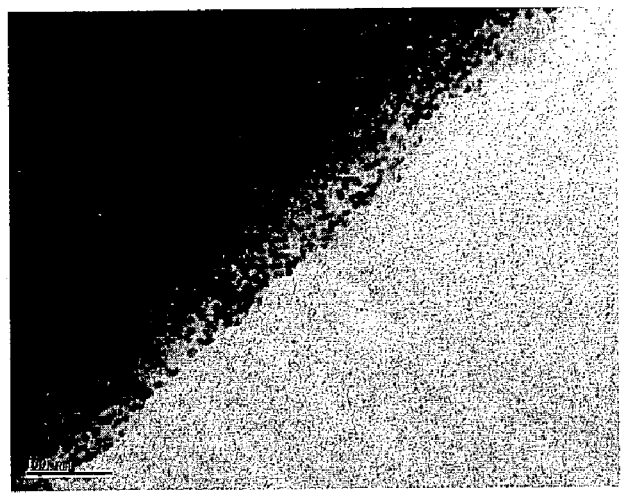
FIG. 14 shows a TEM of a cross section of a 100 nm film consisting of 60 wt. % 10 nm by 10 nm CdSe nanocrystals in P3HT

| nanocrystal loading, wt % | nanocrystal size, nm | nanocrystal material/ polymer | solvent mixture | solvent amount, vol % | Reference |
|---|---|---|---|---|---|
| 90 | 7 × 7 | CdSe/P3HT | pyr/chlor. | 100 | FIG. 4 |
| 90 | 9 × 13 | CdSe/P3HT | pyr/chlor | 0-20 | FIG. 6 |
| 90 | 3 × 100 | CdSe/P3HT | pyr/chlor | 12 | |
| 90 | 7 × 60 | CdSe/P3HT | pyr/chlor | 4 | |
| 0-95 | 3 × 60 | CdSe/P3HT | pyr/chlor | | FIG. 8 |
| 60 | 10 × 10 | CdSe/P3HT | pyr/chlor | | FIG. 14 |
| 40 | 7 × 60 | CdSe/P3HT | pyr/chlor | | FIG. 15 |

Nanocrystals were synthesized using pyrolysis of organometallic precursors in a mixture consisting mainly of trioctylphosphine oxide (TOPO) and tributyl- or trioctylphosphine and small amounts of various phosphonic acids by those techniques known in the art, see Peng et al., Nature 2000, 404, 59; and Peng et al. J. Am. Chem. Soc. 2001, 123, 1389. The recovered product was dispersed and washed three times in methanol to remove excess surfactant. Pyridine treatment of the nanocrystals to remove the surfactant used in the synthesis of nanorods was accomplished by dissolving the particles in pyridine and subsequent precipitation in hexanes. Whereas TOPO coated CdSe nanocrystals are soluble in hexanes, pyridine-coated particles are insoluble in hexanes. Repeating the pyridine treatment two to three times can effectively replace more than 95% of the TOPO on the nanocrystal surface with pyridine.

CdTe tetrapods were synthesized as described in U.S. Ser. No. 10/301,510, filed Nov. 20, 2002, currently pending, substantially as follows. Cadmium oxide (CdO) (99.99+%), Tellurium (Te) (99.8%, 200 mesh), and tri-n-octylphosphine oxide (C24H51OP or TOPO, 99%) were purchased from Aldrich. n-Octadecylphosphonic acid (C18H39O3P or ODPA, 99%) was purchased from Oryza Laboratories, Inc. Trioctylphosphine (TOP) (90%) was purchased from Fluka. All solvents used were anhydrous, purchased from Aldrich, and used without any further purification. All manipulations were performed using standard air-free techniques. The Cd/Te molar ratio was varied from 1:1 to 5:1, and the Cd/ODPA molar ratio was varied from 1:2 to 1:5. The Te precursor solution was prepared by dissolving tellurium powder in TOP (concentration of Te 10 wt. %). The mixture was stirred for 30 minutes at 250° C. then cooled and centrifuged to remove any remaining insoluble particles. In a typical synthesis of CdTe tetrapods, a mixture of ODPA, TOPO, and CdO was degassed at 120° C. for 20 minutes in a 50 ml three-neck flask connected to a Liebig condenser. It was heated slowly under Ar until the CdO decomposed and the solution turned clear and colorless. Next, 1.5 g of trioctyl phosphine (TOP) was added and the temperature was further raised to 320° C. After that, the Te:TOP precursor solution was injected quickly. The temperature dropped to 315° C. and was maintained at this value throughout the synthesis. All syntheses were stopped after 5 minutes by removing the heating mantle and by rapidly cooling the flask. After cooling the solution to 70° C., 3-4 ml anhydrous toluene were added to the flask, and the dispersion was transferred to an Ar drybox. The minimum amount of anhydrous methanol, which was used to precipitate the nanocrystal particles after centrifugation, was added to the dispersion. In this way, potential co-precipitation of the Cd-phosphonate complex was prevented. After removing the supernatant, the precipitate was re-dissolved twice in toluene and re-precipitated with methanol. After removing the supernatant, the final precipitate was stored in the drybox. All resulting CdTe tetrapods were readily soluble in solvents such as chloroform or toluene.

Example 1

Figure 2:
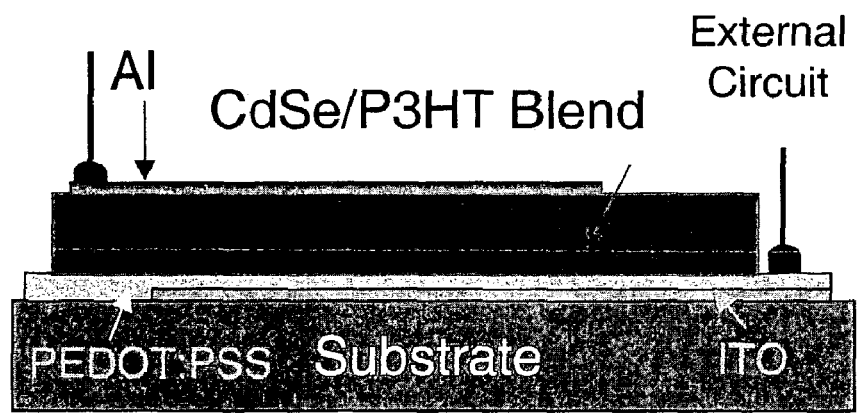
FIG. 2 shows a schematic of the structure of a nanorod-polymer blend photovoltaic device according to one embodiment of the invention.

According to one embodiment of the invention, photovoltaic devices were fabricated from spin casting a solution of CdSe nanocrystals and P3HT in a pyridine-chloroform solvent mixture onto an ITO coated glass substrate under inert atmosphere, pumping for 12 hours under <$10^{-6}$ mbar and evaporating aluminum on top to obtain the structure depicted in FIG. 2.

Example 2 a. Nanocrystal Synthesis: According to another embodiment of the invention long CdSe nanorods in P3HT (90 wt % CdSe) were synthesized as follows: Cd stock: 0.161 g of dimethylcadmium was dissolved in 0.34 g of trioctylphosphine (TOP). Se stock: 0.2 g of Se in 2.367 g of TOP was dissolved. In a three neck flask, 3.536 g of trioctylphosphine oxide (TOPO), 0.187 g of hexylphosphonic acid (HPA), and 0.357 g tetradecylphosphonic acid (TDPA) were mixed. This mixture was heated and degassed under argon to 360 C. Cd stock was slowly injected, then the temperature was lowered to 330 C. the Se stock was rapidly injected. The reaction was allowed to proceed at 290 C. for 18 minutes then the heat was removed. At 40 C., about 15 mL of methanol was added to the flask. The mixture was centrifuged and the supernatant was discarded. 8 mL of methanol was added, vortex, then again centrifuge, discarding the supernatant.

b. Substrate Preparation: Wash indium tin oxide (ITO) on glass substrates by sonication in a series of solvents. After the final solvent wash, dry the samples and insert them into a precleaned plasma chamber. Treat the samples face down with a plasma for 4 minutes. As soon as the samples are removed from the chamber, begin deposition of PEDOT:PSS (purchased from Bayer—electronic grade). Deposit PEDOT: PSS by spin casting at 3000 rpms after filtering through a 0.2 micron acetate filter. Dry the films by heating under flowing argon for one hour at 120 C.

c. Nanocrystal washing: Divided the synthesized nanorods in half and added 8 mL of methanol to each half. Centrifuged and discarded the supernatant, then repeated this process again. Added 0.35 mL of pyridine to each half to dissolve the nanorods, heated at 120 C. and occasionally vortexed for 10 min. Precipitated with 8 mL of hexane for each half. Centrifuged and discarded the supernatant. Dissolved the nanorods in a chloroform/pyridine mixture with 9.2% pyridine to give a concentration of 83.mg/mL of nanocrystals.

d. Active Layer Deposition Dissolved regioregular poly(3-hexylthiophene) (P3HT) in chloroform at 30 mg/mL. Used this solution and the above described nanorod solution (see III above) to prepare a cosolution of nanorods and P3HT in a chloroform/pyridine mixture with a 9:1 mass ratio of nanorods to P3HT and a P3HT concentration of 4.55 mg/mL. From this solution, spin cast a thin film on a prepared substrate (see II above) at 1350 rpm.

e. Electrode Deposition: Loaded the samples into an evaporation chamber and allowed them to pump under vacuum for at least 8 hours, reaching a pressure below $10^{-6}$ torr. Thermally deposited an aluminum film approximately 100 nm thick through a shadow mask to define the top electrodes.

Example 3

CdTe Tetrapods in P3HT

CdTe tetrapod nanocrystals having a core and 4 arms of approximately 80 nm in length were synthesized then washed with several dissolution/precipitation steps in tetrahydrofuran (THF) and ethylacetate.

The nanocrystals were then codissolved in solvent chloroform with the ligand phenylphosphonic acid and heated at around 100 C. for several hours.

The nanocrystals were then precipatated with methanol and redissolved in chloroform.

The nanocrystal solution was mixed with a P3HT solution as described in example 2 and spin cast to create thin films.

Substrates and electrodes were processed as in example 2. The EQE value for this sample was less than 10%.

Example 4

CdTe Tetrapods in P3HT

CdTe tetrapods were synthesized and washed with toluene and methanol as in example 3 (with THF and ethylacetate).

The nanocrystals (about 50 mg) were then codissolved in about 2 ml solvent chloroform with about 1000 mg of ligand hexylphosphonic acid (HPA) and heated for several hours.

The rest of the procedure followed example 3. The EQE value for this sample was less than 10%.

Example 5

CdTe Tetrapods in P3HT

Proceeded as in example 4, but additionally dissolved the nanocrystals in tributylphosphine (TBP) and stirred for 20 hours before precipitating with methanol.

Then proceeded as in example 3. The EQE value for this sample was less than 10%.

Example 6

CdTe Tetrapods in MEH-PPV

Proceed as in example 3, but redissolve nanocrystals in solvent p-xylene after final methanol precipitation. This example thus will have the ligand phenylphosphonic acid.

Prepare a solution of MEH-PPV in p-xylene, mix this with the nanocrystals and this can be cast blend into films as in example 2.

Example 7

CdSe Nanorods in P3HT

Proceed as in example 2 except the ligand pyridine can be replaced with n-butylamine or n-hexylamine in every step.

Example 8

CdSe Nanorods in P3HT

Proceed as in example 4, but replace CdTe nanocrystals with CdSe nanocrystals.

Also, replace HPA with T1 for use as the ligands.

Example 9

CdSe or CdTe Nanocrystals in P3HT

Proceed as in example 8 with either CdSe or CdTe nanocrystals.

Replace HPA with T5-PA

Characterization of Samples.

Nanocrystal size, morphology and structure were measured by TEM using a FEI Tecnai 12 120 kV microscope. Thin films of CdSe—P3HT (regioregular P3HT from Aldrich) blends approximately 50-100 nm thick were investigated using TEM by casting a film on a NaCl IR window, floating the film in water and picking it up with a copper TEM grid. The morphology of the blend films was also characterized directly on devices via atomic force microscopy in tapping mode using a Nanoscope IIIa from Digital Instruments. Film thicknesses were determined via AFM.

The absorption of the CdSe—P3HT blend films was determined with an Agilent Chemstation UV/V is spectrophotometer. Photocurrent measurements were completed using a 250 Watt tungsten light source coupled to an Acton SPI50 monochromator as an illumination source and a Keithley 236 Source Measure Unit to obtain current and voltage. The light intensity was measured with a calibrated Graseby silicon photodiode.

Photoluminescence quenching experiments were completed on CdSe—P3HT films of thickness 100-200 nm spin cast on glass substrates. The absolute photoluminescence of the sample under excitation at 514 nm from an argon ion laser was measured with an integrating sphere following the method described by deMello et al, *Adv. Mater.* 1997, 9, 230.

The efficiency of a photovoltaic device can be described in two ways, see Rostalski, J. *Sol. Energy Mater. Sol. Cells* 61, 87 (2000), the contents of which are hereby incorporated by reference in its entirety. The first is a number efficiency, the external quantum efficiency (EQE), which expresses the number of photons that are converted to electrons. The second is a power conversion efficiency, which states how much electrical power is produced per unit of incident radiative power. Although the EQE is important to understand the mechanisms of current generation, it is rarely given as measure of the efficiency of a commercial solar cell. More important for these commercial devices is the power conversion efficiency of the device under solar conditions.

For commercial applications, the most important parameter is the power conversion efficiency $\eta$ of a photovoltaic cell. Since electrical power is a product of the current and voltage, the power conversion efficiency is determined from measuring the current as a function of voltage. The power conversion efficiency can be expressed in terms of the power of the incoming light $P_{light}$ and the electrical output power $P_{out}$ of the cell:

$$\eta(\lambda) = \frac{P_{out}(\lambda)}{P_{light}(\lambda)}$$

Figure 24:
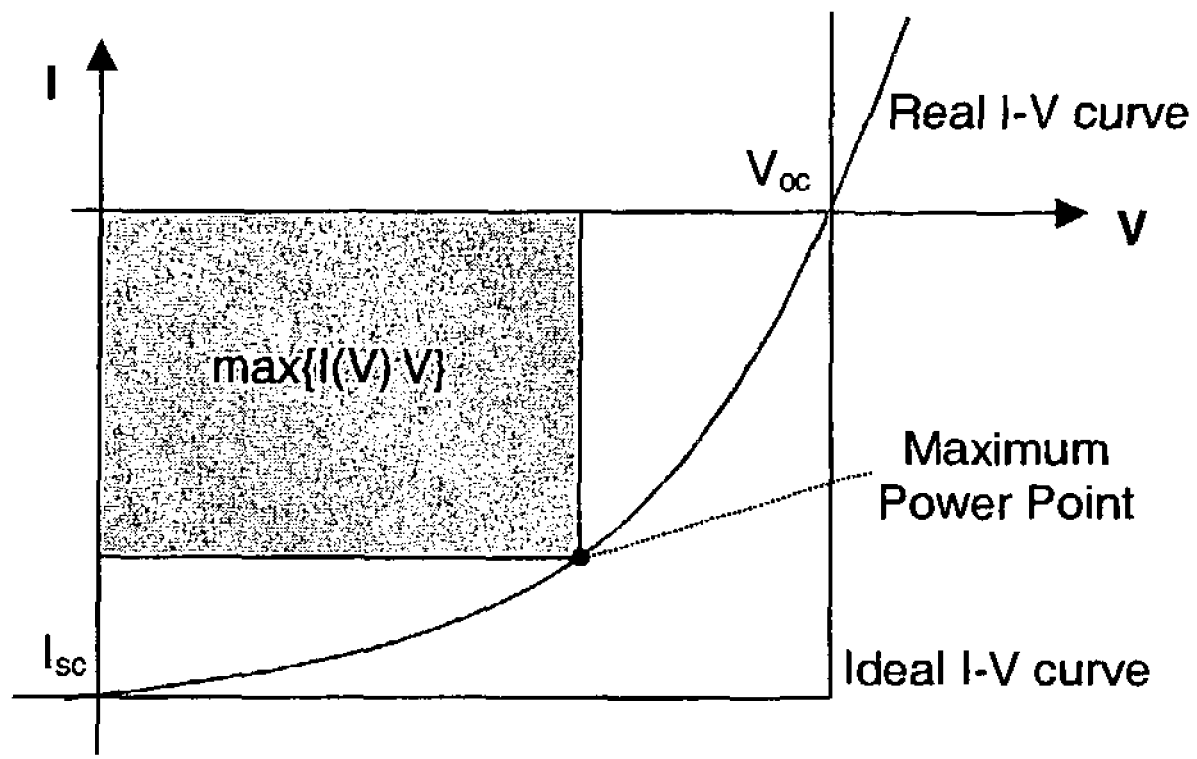
FIG. 24 shows both the ideal and a typical I-V curve found experimentally.

The maximum theoretical power output is given by the product of the short circuit photocurrent $I_{SC}$ and the open circuit voltage $V_{OC}$. FIG. 24 shows both the ideal and a typical I-V curve found experimentally. The area of the inner rectangle corresponds to the maximal output power of the real device (at the maximum power point), whereas the area of the outer rectangle formed by the axes and the ideal I-V curve is equivalent to the maximum ideal output power. Real I-V characteristics are curved and we have to maximize the product of current and voltage in order to obtain the maximum power output. The ratio between the maximum theoretical power output and the actual maximum power output is an important feature of the I-V characteristics. This ratio is called the fill factor FF and can be defined as $$FF(\lambda) = \frac{\max_{0<V<V_{oc}}\{I(V(\lambda)) \cdot V(\lambda)\}}{I_{sc}(\lambda) \cdot V_{oc}(\lambda)}$$

If we express the maximum output power of a photovoltaic cell using the fill factor, the power conversion efficiency becomes $$\eta(\lambda) = \frac{I_{sc}(\lambda) \cdot V_{oc}(\lambda) \cdot FF(\lambda)}{P_{light}(\lambda)}$$

A large amount of information is contained within the I-V characteristics of a device. The $I_{SC}$ is proportional to the EQE and coupled with the $V_{OC}$ and FF, it provides all the parameters required to characterize the power efficiency of the cell.

The invention described herein contemplates that photovoltaic cells described herein have a power conversion efficiency of at least greater than 1% A.M. 1.5 global illumination. More preferably the amount is greater than 5%. Even more preferably the amount is greater than 10%. Most preferably the amount is up to 30%.

The power conversion efficiency can be given under monochromatic or white light illumination. Monochromatic power conversion efficiencies are not sufficient to characterize a solar cell but are a measure of the performance of the device at a specific wavelength. This is useful for the case that the device is intended for use under conditions other than solar, such as in small electronic devices and watches which function under ambient room lighting or as a power meter for laser radiation. The standard method of characterizing a solar cell is under Air Mass 1.5 or A.M 1.5 conditions (sun's emission spectrum after traveling 1.5 times through the Earth's atmosphere). This solar illumination is generally simulated, as standard A.M 1.5 conditions are difficult to obtain reliably due to non-ideal weather conditions.

Embodiments of the invention can exhibit high power conversion efficiency. As noted above, some embodiments of the invention are capable of having power conversion efficiencies greater than about 1%. Other embodiments may have power conversion efficiencies: between about 1% and 30%, between about 2% and 30%, between about 5% and about 15%, or greater than about 1.7%.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

All patents, patent applications, and publications mentioned above are herein incorporated by reference in their entirety for all purposes. None of the patents, patent applications, and publications mentioned above are admitted to be prior art.

What is claimed is:

1. A thin film capable of use in a photovoltaic device, the thin film comprising:
   a semiconducting conjugated polymer having at least 5 wt % semiconductor-nanocrystals embedded therein, wherein:
   at least a portion of the semiconductor-nanocrystals have an aspect ratio greater than about 2, and wherein the thin film is capable of providing a power conversion efficiency greater than 2% at A.M. 1.5 global illumination when in the photovoltaic device.

2. The thin film of claim 1, wherein: the semiconducting conjugated polymer has between about 5 and about 99 wt % of semiconductor-nanocrystals embedded therein.

3. The thin film of claim 1, wherein: the semiconducting conjugated polymer has between about 20 and 95 wt % semiconductor-nanocrystals embedded therein.

4. The thin film of claim 1, wherein: the semiconducting conjugated polymer has between about 50 and 95 wt % semiconductor-nanocrystals embedded therein.

5. The thin film of claim 1, wherein: the semiconducting conjugated polymer has about 90 wt % semiconductor-nanocrystals embedded therein.

6. The thin film of claim 1, wherein: the semiconducting conjugated polymer is chosen from the group consisting of trans-polyacetylenes, polypyrroles, polythiophenes, polyanilines, poly(p-phenylene)s and polyp-phenylene-vinylene)s, polyfluorenes, polyaromatic amines, poly(thienylene-vinylene)s and soluble derivatives thereof.

7. The thin film of claim 6, wherein: the conjugated polymer is chosen from the group consisting of (poly(2-methoxy 5-(2'-ethylhexyloxy)p-phenylenevinylene)(MEH-PPV) and poly(3-hexylthiophene, (P3HT).

8. The thin film of claim 1, wherein: the semiconductor-nanocrystals comprise rods having a length of greater than about 20 nm.

9. The thin film of claim 1, wherein: the semiconductor-nanocrystals comprise rods having a length of between about 20 nm and about 200 nm.

10. The thin film of claim 9, wherein: the semiconductor-nanocrystals comprise rods having a length of between about 60 nm and about 110 nm.

11. The thin film of claim 1, wherein: the semiconductor-nanocrystals comprise rods that are about 7 nm×60 nm.

12. The thin film of claim 1, wherein: the semiconductor-nanocrystals comprise a semiconductor selected from the group consisting of Group II-VI, Group III-V, Group IV semiconductors and tertiary chalcopyrites.

13. The thin film of claim 12, wherein: the semiconductor-nanocrystals are selected from the group consisting of CdSe, CdTe, InP, GaAs, $CuInS_2$, $CuInSe_2$, AlGaAs, InGaAs, Ge and Si.

14. The thin film of claim 1, wherein the semiconductor-nanocrystals are selected from the group consisting of CdSe and CdTe.

15. The thin film of claim 1, wherein: a portion of the semiconductor-nanocrystals are branched nanocrystals.

16. The thin film of claim 15, wherein: a portion of the branched nanocrystals have at least two arms, said arms are not all the same length.

17. The thin film of claim 15, wherein: the branched nanocrystals do not all have the same shape.

18. The thin film of claim 15, wherein: the branched nanocrystals have 4 arms and have a tetrahedral symmetry.

19. The thin film of claim 18, wherein: the branched nanocrystals are either CdSe or CdTe and are embedded in an amount of about 90 wt %.

20. The thin film of claim 1, wherein: the film has a thickness of from about from about 100 nm to about 350 nm.

21. The thin film of claim 18, wherein: the film has a thickness of about 200 nm.

22. A photovoltaic device, comprising: the thin film of claim 1.

23. The photovoltaic device of claim 22, wherein: at least a portion of the semiconductor-nanocrystals have an aspect ratio greater than about 5.

24. The photovoltaic device of claim 22, wherein: at least a portion of the semiconductor-nanocrystals have an aspect ratio greater than about 10.

25. The photovoltaic device of claim 22, wherein: at least a portion of the semiconductor-nanocrystals have an aspect ratio of between about 5 and about 50.

26. The photovoltaic device of claim 22, wherein: at least a portion of the semiconductor-nanocrystals have an aspect ratio of between about 2 and about 10.

27. The photovoltaic device of claim 22, wherein: the semiconducting conjugated polymer has between about 5 and about 99 wt % of semiconductor-nanocrystals embedded therein.

28. The photovoltaic device of claim 22, wherein: the semiconducting conjugated polymer has between about 20 and 95 wt % semiconductor-nanocrystals embedded therein.

29. The photovoltaic device of claim 22, wherein: the semiconducting conjugated polymer has between about 50 and 95 wt % semiconductor-nanocrystals embedded therein.

30. The photovoltaic device of claim 22, wherein: the semiconducting conjugated polymer has about 90 wt % semiconductor-nanocrystals embedded therein.

31. The photovoltaic device of claim 22, wherein: the semiconducting conjugated polymer is chosen from the group consisting of trans-polyacetylenes, polypyrroles, polythiophenes, polyanilines, poly(p-phenylene)s and poly(p-phenylene-vinylene)s, polyfluorenes, polyaromatic amines, poly(thienylene-vinylene)s and soluble derivatives thereof.

32. The photovoltaic device of claim 31, wherein: the conjugated polymer is chosen from the group consisting of (poly (2-methoxy5-(2'-ethylhexyloxy-)p-phenylenevinylene) (MEH-PPV) and poly(3-hexylthiophene, (P3HT).

33. The photovoltaic device of claim 22, wherein: the semiconductor-nanocrystals comprise rods having a length of greater than about 20 nm.

34. The photovoltaic device of claim 22, wherein: the semiconductor-nanocrystals comprise rods having a length of between about 20 nm and about 200 nm.

35. The photovoltaic device of claim 34, wherein: the semiconductor-nanocrystals comprise rods having a length of between about 60 nm and about 110 nm.

36. The photovoltaic device of claim 22, wherein: the semiconductor-nanocrystals comprise rods that are about 7 nm×60 nm.

37. The photovoltaic device of claim 22, wherein: the semiconductor-nanocrystals comprise a semiconductor selected from the group consisting of Group II-VI, Group III-V, Group IV semiconductors and tertiary chalcopyrites.

38. The photovoltaic device of claim 37, wherein: the semiconductor-nanocrystals are selected from the group consisting of CdSe, CdTe, InP, GaAs, $CuInS_2$, $CuInSe_2$, AlGaAs, InGaAs, Ge and Si.

39. The photovoltaic device of claim 22, wherein: the semiconductor-nanocrystals are selected from the group consisting of CdSe and CdTe.

40. The photovoltaic device of claim 22, wherein: a portion of the semiconductor-nanocrystals are branched nanocrystals.

41. The photovoltaic device of claim 40, wherein: a portion of the branched nanocrystals have at least two arms, said arms are not all the same length.

42. The photovoltaic device of claim 40, wherein: the branched nanocrystals do not all have the same shape.

43. The photovoltaic device of claim 40, wherein: the branched nanocrystals have 4 arms and have a tetrahedral symmetry.

44. The photovoltaic device of claim 43, wherein: the branched nanocrystals are either CdSe or CdTe and are embedded in an amount of about 90 wt %.

45. The photovoltaic device of claim 22, wherein: the film has a thickness of from about from about 100 nm to about 350 nm.

46. The photovoltaic device of claim 45, wherein: the film has a thickness of about 200 nm.

* * * * *